(12) United States Patent
Kadoya

(10) Patent No.: US 8,134,398 B2
(45) Date of Patent: Mar. 13, 2012

(54) DEVICE HAVING GATE WITH TWO BURIED PORTIONS WITH DIFFERENT WIDTHS

(75) Inventor: Tomohiro Kadoya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/946,030

(22) Filed: Nov. 15, 2010

(65) Prior Publication Data

US 2011/0057260 A1  Mar. 10, 2011

Related U.S. Application Data

(62) Division of application No. 12/335,964, filed on Dec. 16, 2008, now Pat. No. 7,859,038.

(30) Foreign Application Priority Data

Oct. 31, 2008   (JP) ................................. 2008-281093

(51) Int. Cl.
*H01L 27/108* (2006.01)

(52) U.S. Cl. .................................. 327/304; 257/E27.084
(58) Field of Classification Search .................. 257/296, 257/304, E27.084
See application file for complete search history.

(56) References Cited

U.S. PATENT DOCUMENTS

| 6,596,607 | B2 | 7/2003 | Ahn |
| 2002/0072198 | A1 | 6/2002 | Ahn |
| 2007/0132015 | A1 | 6/2007 | Kujirai |

FOREIGN PATENT DOCUMENTS

| JP | 04-230077 | 8/1992 |
| JP | 05-190791 | 7/1993 |
| JP | 09-275197 | 10/1997 |
| JP | 2002-203895 | 7/2002 |
| JP | 2007-158269 | 6/2007 |

*Primary Examiner* — Thomas L Dickey
(74) *Attorney, Agent, or Firm* — Young & Thompson

(57) ABSTRACT

A dummy transistor and a field effect transistor are arranged in a second direction. The dummy transistor is located at least at one end in a second direction.

17 Claims, 21 Drawing Sheets

Cross section B-B'

FIG. 3 Cross section A-A'

FIG. 5 Cross section A-A'

Cross section B-B'

Cross section B-B'

FIG. 9 Cross section A-A'

Cross section A-A'

Cross section B-B'

Cross section B-B'

FIG. 15 Cross section B-B'

Cross section C-C'

DEVICE HAVING GATE WITH TWO BURIED PORTIONS WITH DIFFERENT WIDTHS

CROSS REFERENCE TO RELATED APPLICATIONS

This application is a divisional of co-pending application Ser. No. 12/335,964 filed on Dec. 16, 2008, which claims priority to Japanese Patent Application No. 2008-281093, filed on Oct. 31, 2008. The entire contents of each of the above-identified applications are hereby incorporated by reference.

BACKGROUND OF THE INVENTION

1. Field of the Invention

The present invention relates to a semiconductor device.

2. Description of the Related Art

Increasingly integrated semiconductor devices have led to increasing miniaturization of semiconductor elements used in the semiconductor devices. In recent semiconductor devices, STI (shallow Trench Isolation) formed by filling an insulating film into a trench in a semiconductor layer is used as an isolation region. Miniaturized STI hinders the insulating film from being filled into the trench by means of a CVD method or the like during formation of the STI. Thus, for the formation of the STI, a method has been proposed which fills an interior of the trench with a two-layer structure including an SOD (Spin On Dielectrics) film that can be formed by applying polysilazane or the like and a silicon oxide film ($SiO_2$) formed by the CVD method (Japanese Patent Laid-Open No. 2002-203895).

Furthermore, as a result of the miniaturization, instead of related planar transistors, a new type of transistor has been used as a MOS transistor. The new type of transistor includes a trench-shaped gate electrode that effectively prevents a possible short channel effect or a channel layer formed on a side surface portion of a trench for the gate electrode (Japanese Patent Laid-Open No. 2007-158269).

Thus, as a semiconductor device such as a DRAM which can be miniaturized and which includes, on a semiconductor chip, a memory cell region and a peripheral circuit region that is different from the memory cell region, a possible semiconductor device includes, in a memory cell region, an isolation region of the STI with a two-layer structure such as the one described in Japanese Patent Laid-Open No. 2002-203895 and a transistor including a trench-shaped gate electrode structure.

The present inventor has recognized that the semiconductor device with the transistor including the trench-shaped gate electrode structure may pose problems described below.

In the description below, a DRAM including a memory cell with an isolation region of the STI with a two-layer structure will be taken by way of an example.

FIG. 1 is a plan view schematically showing location of an isolation region in an end region of a memory cell in a related DRAM. Reference numeral 101 denotes an active region (impurity diffusion layer region) forming a memory cell. A plurality of active regions are arranged according to a predetermined rule. Each of the active regions is formed by forming isolation region 100 formed of the STI on a semiconductor substrate (not shown in the drawings) to partition the semiconductor substrate. Reference numeral 101a denotes an active region located at an end of a memory cell region.

Reference numeral 102 denotes an active region formed at a boundary portion between the memory cell region and a peripheral circuit region and used to, for example, fix a substrate potential (well potential) of the memory cell region. The isolation region positioned between terminal active region 101a and active region 102 is denoted by D1. The isolation region between active regions 101 in the memory cell region is denoted by D2. The isolation region between active region 101a at the end of the memory cell and the active region located adjacent to active region 101a is similarly denoted by D2.

A method for forming isolation region 100 will be described with reference to FIGS. 2 and 3 in sectional views taken along line A-A' in FIG. 1.

As shown in FIG. 2, silicon nitride film ($Si_3N_4$) 105 is used to form a mask pattern on a semiconductor substrate 200 so that the mask pattern covers the active regions. Etching is then performed to form trenches 104 in semiconductor substrate 200. A silicon nitride film is formed in each of trenches 104 as liner film 106. Then, trench 104 is filled with SOD region 107 made of polysilazane or the like. Thermal treatment is then performed in a high-temperature oxidizing atmosphere to convert (reform) SOD region 107 into a dense film.

Thereafter, SOD region 107 is partly removed by wet etching so as to remain in trench 104. An exposed portion of liner film 106 is also removed. The conversion of SOD region 107 into the dense film progresses more easily in isolation region D1 positioned at the end of the memory cell than in isolation region D2 in the memory cell region.

The reason is that the opening width of the trench in isolation region D1 is larger than that in isolation region D2. Thus, during the thermal treatment, oxygen is more easily supplied to the SOD region in isolation region D1. Thus, when SOD region 107 is partly removed, an etching rate for the SOD region is higher in isolation region D2 than in isolation region D1. The amount of remaining SOD region 107 (the film thickness of SOD region 107 from a bottom portion of the trench) is larger in isolation region D1 at the end of the memory cell region, than in isolation region D2 inside the memory cell region.

Then, as shown in FIG. 3, an insulating film such as silicon oxide film 108 which is formed by the CVD method is filled on SOD region 107 in the trench. Thereafter, a surface of the insulating film is flattened by a CMP method to remove silicon nitride film 105 for the mask. Moreover, silicon oxide film 108 is partly removed by wet etching. A surface of remaining silicon oxide film 108 is flattened to complete an isolation region.

Then, a trench-shaped gate electrode of a MOS transistor functioning as a word line is formed in the memory cell region. FIG. 4 is a plan view showing location of trenches 110 for gate electrodes. Each of trenches 110 is located so as to completely cross all active regions 101, including the terminal active region 101a.

FIG. 5 shows a cross section of the semiconductor device in which a trench pattern has been formed, the cross section being taken along line A-A'. FIGS. 6 and 7 show cross sections taken along line B-B'. In FIG. 5, reference numeral 115 denotes a silicon nitride film used as a mask when trench 110 is formed by etching. An opening is formed at the position of trench 110. In FIG. 6, trench 110 is formed in a portion of the substrate which is not covered with silicon nitride film 115 for the mask. During the formation of the trench, semiconductor substrate 200 is etched, and the insulating film in the isolation region is etched away. However, the semiconductor substrate is etched deeper owing to an etching selection ratio.

In isolation region D1 at the end of the memory cell region, silicon oxide film 108 is thin before the start of the etching. Thus, during the formation of the trench, the etching progresses until the underlying SOD region 107 is exposed, with liner film 106 accordingly exposed. On the other hand, in isolation region D2 in the memory cell region, silicon oxide film 108 is thick. Thus, SOD region 107 and liner film 106 are prevented from being exposed.

Then, as shown in FIG. 7, silicon nitride film 115 for the mask is removed by wet etching. At this time, in isolation region D1 at the end of the memory cell region, the silicon nitride film used as liner film 106 is exposed. Thus, liner film 106 is removed to form recess portion 120. Etching of liner film 106 also progresses in a lateral direction along a boundary portion between the isolation region and the active region. Thus, recess portion 120 is formed between adjacent trenches 110.

The present inventor has recognized that in this condition, when a gate insulating film is formed and a conductive film such as polycrystalline silicon is then filled into trench 110 for the gate electrode, the conductive film may remain along recess portion 120, formed by removing liner film 106; the remaining conductive film is difficult to remove. When the conductive film thus remains along recess portion 120, a short circuit may occur between the adjacent gate electrodes. FIG. 18 is a top view showing this condition. In FIG. 18, the conductive film remaining in the recess portion is denoted by reference numerals 121 and 122. As shown in FIG. 18, conductive film 122 is present between two trenches 110. During a subsequent step, a conductive material is deposited in trench 110 to form the gate electrode. Thus, the gate electrodes formed in two trenches 110 are short-circuited by conductive film 122. Therefore, manufacturing yield may decrease as a result of an attempt to manufacture a semiconductor device with a memory cell region by the relevant method.

SUMMARY OF THE INVENTION

The present invention seeks to solve one or more of the above problems, or to improve upon those problems at least in part.

In one embodiment, there is a semiconductor device provided a semiconductor substrate;
  a semiconductor portion on the semiconductor substrate;
  an array of semiconductor regions on the semiconductor substrate, the array of semiconductor regions including a first semiconductor region extending in a first direction and a plurality of second semiconductor regions extending in the first direction, the first semiconductor region and the second semiconductor regions being periodically arranged in a second direction, the first semiconductor region being located at the shortest distance from the semiconductor portion in the second direction;
  a first isolation region formed between the semiconductor portion and the first semiconductor region;
  second isolation regions formed between the adjacent first and second semiconductor regions and between the adjacent second semiconductor regions, the second isolation regions being narrower than the first isolation region in the second direction;
  a liner film formed on an inner wall of trench making up each of the first and the second isolation regions;
  a dense film formed on the liner film in the trench making up each of the first and the second isolation regions;
  a gate electrode extending in the second direction, the gate electrode including buried portions buried in the first semiconductor region and each of the second semiconductor regions, and an extending portion coupling the buried portions together;
  a gate insulating film formed between the buried portion of the gate electrode and the semiconductor substrate at the second semiconductor region; and
  a source region and a drain region of a field effect transistor, the source and drain regions being formed in the second semiconductor region on both sides sandwiching the buried portion of the gate electrode in the first direction,
  wherein the buried portion of the gate electrode in the first semiconductor region is narrower than the buried portion of the gate electrode in the second semiconductor region in the second direction.

In one of the other embodiments, there is a semiconductor device including:
  an element region;
  a semiconductor portion;
  an array of semiconductor regions including a protruding first semiconductor region extending in a first direction and a plurality of protruding second semiconductor regions extending in the first direction, the first semiconductor region and the second semiconductor regions being periodically arranged in a second direction, the first semiconductor region making up a semiconductor region located at the shortest distance from the semiconductor portion in the second direction, in the element region;
  a first isolation region formed between the semiconductor portion and the first semiconductor region;
  second isolation regions formed between the adjacent first and second semiconductor regions and between the adjacent second semiconductor regions, the second isolation regions being narrower than the first isolation region in the second direction;
  a liner film formed on an inner wall of trench making up each of the first and the second isolation regions;
  an SOD region formed on the liner film in the trench making up each of the first and the second isolation regions;
  a gate electrode including buried portions buried in intermediate portions of the first and the second semiconductor regions in the first direction, and an extending portion coupling the buried portions together and extending over the intermediate portion of each of the first and the second semiconductor regions in the second direction;
  a gate insulating film formed in contact with the buried portion of the gate electrode buried in the second semiconductor region; and
  a source region and a drain region formed in the second semiconductor region on both sides sandwiching the buried portion of the gate electrode in the first direction,
  wherein the second semiconductor region, the gate electrode, the gate insulating film, and the source and the drain regions make up a field effect transistor, and
  the buried portion of the gate electrode in the first semiconductor region is narrower than the buried portion of the gate electrode in the second semiconductor region in the second direction.

In another embodiment, there is provided a semiconductor device comprising:
  an array of semiconductor regions including a protruding first semiconductor region extending in a first direction and a plurality of protruding second semiconductor regions extending in the first direction, the first semiconductor region and the second semiconductor regions being arranged in a second direction, the first semiconductor region making up a semiconductor region located at least at one end of the array in the second direction;

a gate electrode including buried portions buried in intermediate portions of the first and the second semiconductor regions in the first direction, and an extending portion coupling the buried portions together and extending over the intermediate portion of each of the first and the second semiconductor regions in the second direction;

a gate insulating film formed in contact with the buried portion of the gate electrode buried in the second semiconductor region; and a source region and a drain region formed in the second semiconductor region on both sides sandwiching the buried portion of the gate electrode in the first direction, wherein the second semiconductor region, the gate electrode, the gate insulating film, and the source and the drain regions make up a field effect transistor, and the buried portion of the gate electrode in the first semiconductor region is narrower than the buried portion of the gate electrode in the second semiconductor region in the second direction.

In another embodiment, there is provided a semiconductor device comprising:

a dummy transistor including a protruding first semiconductor region extending in a first direction;

a protruding second semiconductor region extending in the first direction;

a gate electrode including buried portions buried in intermediate portions of the first and the second semiconductor regions in the first direction, and an extending portion coupling the buried portions together and extending over the intermediate portion of each of the first and the second semiconductor regions in a second direction; and a field effect transistor including the second semiconductor region, the buried portion of the gate electrode buried in the second semiconductor region, a gate insulating film formed in contact with the buried portion in the second semiconductor region, and a source region and a drain region formed in the second semiconductor region on both sides thereof sandwiching the buried portion of the gate electrode in the first direction, wherein the dummy transistor and the field effect transistor make up an array arranged in the second direction, and the dummy transistor is located at least at one end of the array in the second direction, and the buried portion of the gate electrode in the first semiconductor region is narrower than the buried portion of the gate electrode in the second semiconductor region in the second direction.

In another embodiment, there is provided a semiconductor device comprising:

an element region including a plurality of field effect transistors including a protruding semiconductor region and a trench-shaped gate electrode buried in the semiconductor region, the field effect transistors being periodically arranged in a second direction, wherein the trench-shaped gate electrode buried in one or two first field effect transistors among the plurality of field effect transistors positioned at an end of the element region in the second direction are narrower, in the second direction, than the trench-shaped gate electrode buried in the semiconductor region of a second field effect transistor other than the first field effect transistor.

The "element region" refers to the first and second semiconductor regions or a region occupying a given area in which the semiconductor region is formed.

The "semiconductor portion" refers to a region occupying a given area formed adjacent to the element region and composed of a semiconductor.

The "first isolation region" and the "second isolation region" have only to be insulating regions occupying a given area. The first and second isolation regions may be partly coupled together, and the second isolation regions may be partly coupled together.

The "intermediate portion of each of the first and second semiconductor regions in the first direction" refers to a portion of each of the first and second semiconductor regions in the first direction other than end portions thereof in the first direction.

FIG. 19 is a sectional view of the semiconductor device in FIG. 14 which view is taken along line B-B', and shows that the width of each of the first and second isolation regions varies in a depth direction (corresponding to a direction perpendicular to the first and second directions) of each of the first and second isolation regions. In this case, as shown in FIG. 19, when the width of the second isolation region in the second direction is smaller than that of the first isolation region in the second direction, at all heights such as heights A, B, and C in depth direction 123, "the second isolation region is narrower than the first isolation region in the second direction".

FIG. 20 is a sectional view of the semiconductor device in FIG. 14 which view is taken along line B-B', and shows that the width of the buried portion of the gate electrode in each of the first and second semiconductor regions varies in the depth direction (corresponding to the direction perpendicular to the first and second directions) of each of the first and second semiconductor regions. As shown in FIG. 20, "the buried portion of the gate electrode in the first semiconductor region is narrower than that in the second semiconductor region in the second direction" means that the width of the buried portion in the first semiconductor region in the second direction is smaller than that of the second semiconductor region in the second direction, at all the heights such as heights A, B, and C in depth direction 123.

In the above-described exemplary embodiments, when the buried portion of the gate electrode is formed, the internal liner film is prevented from being exposed from the isolation region located adjacent to the terminal semiconductor region. This prevents possible formation of a recess portion as a result of removal of the liner film. Therefore, a conductor for the gate electrode remains in the possible recess portion to prevent a possible short circuit between the adjacent gate electrodes.

The present invention can prevent a situation in which the recess portion remains at the boundary portion between the semiconductor region at the end of the arrangement of the semiconductor regions and the isolation region located adjacent to the semiconductor region and in which a conductive film formed in the recess portion causes a short circuit between the gate electrodes arranged adjacent to each other. As a result, manufacturing yield of the semiconductor device can be improved.

BRIEF DESCRIPTION OF THE DRAWINGS

The above features and advantages of the present invention will be more apparent from the following description of certain preferred embodiments taken in conjunction with the accompanying drawings, in which.

DESCRIPTION OF SYMBOLS

Figure 1:
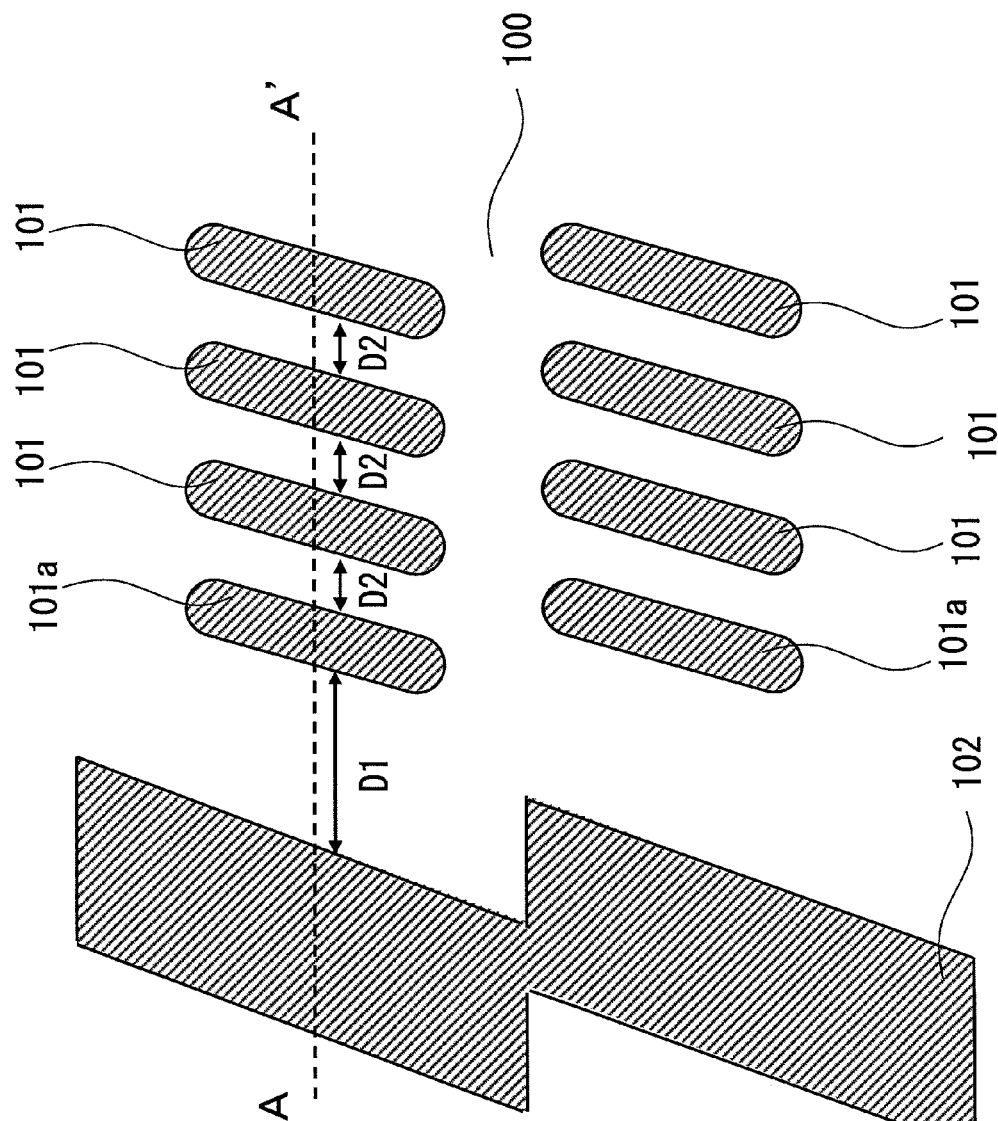
FIG. 1 is a diagram illustrating a step of a method for manufacturing a related semiconductor device.
Figure 2:
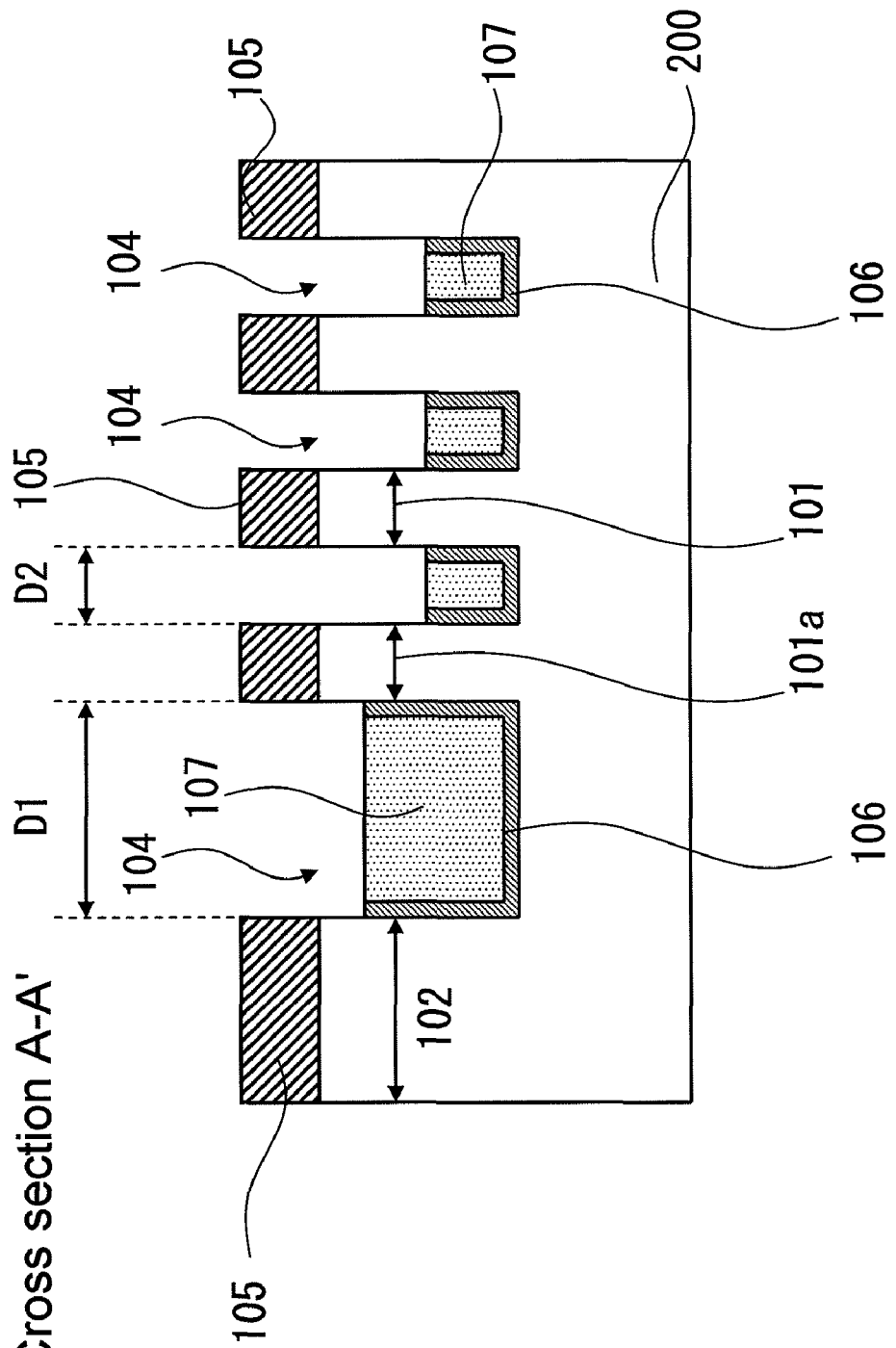
FIG. 2 is a diagram illustrating a step of the method for manufacturing the related semiconductor device.
Figure 3:
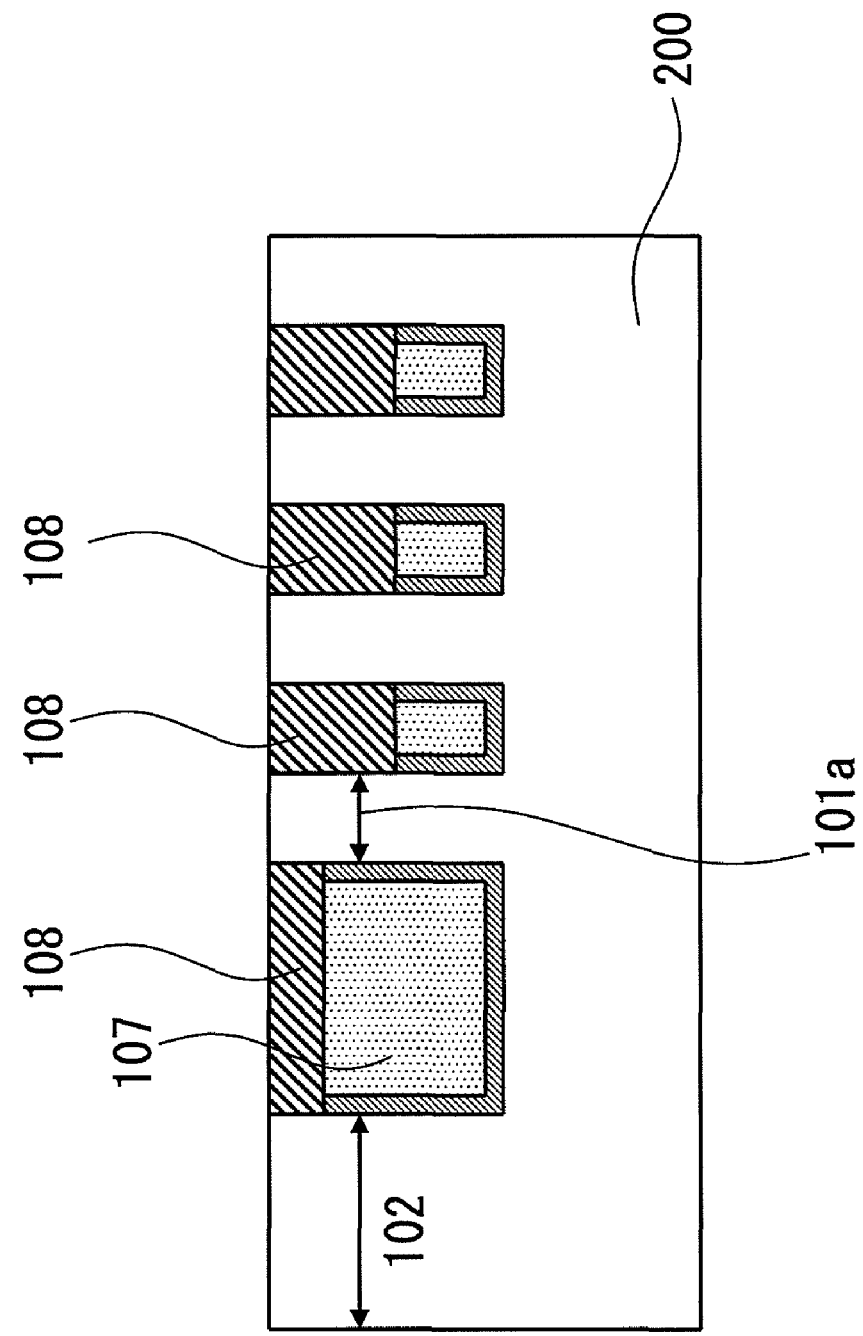
FIG. 3 is a diagram illustrating a step of the method for manufacturing the related semiconductor device.
Figure 4:
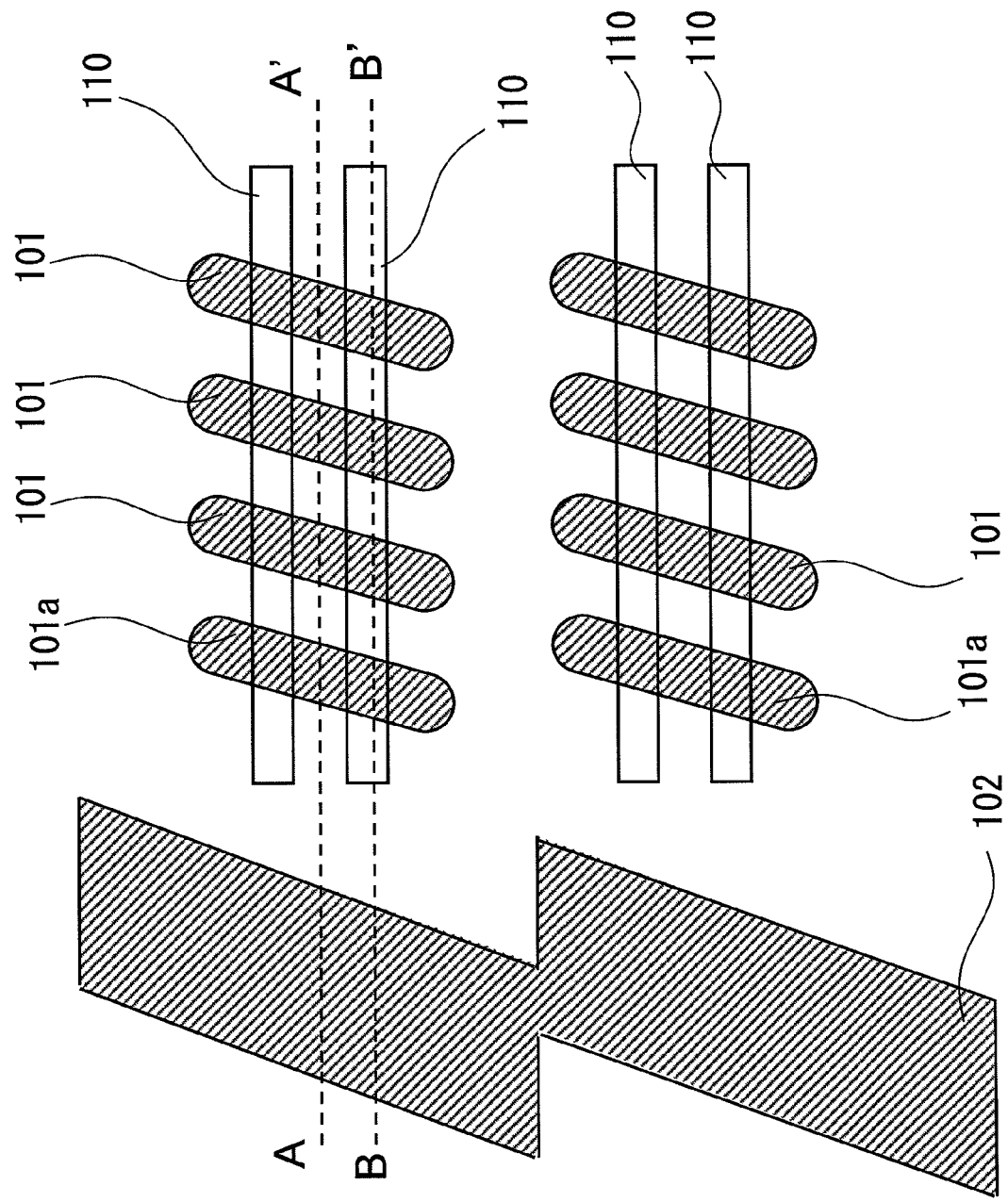
FIG. 4 is a diagram illustrating a step of the method for manufacturing the related semiconductor device.
Figure 5:
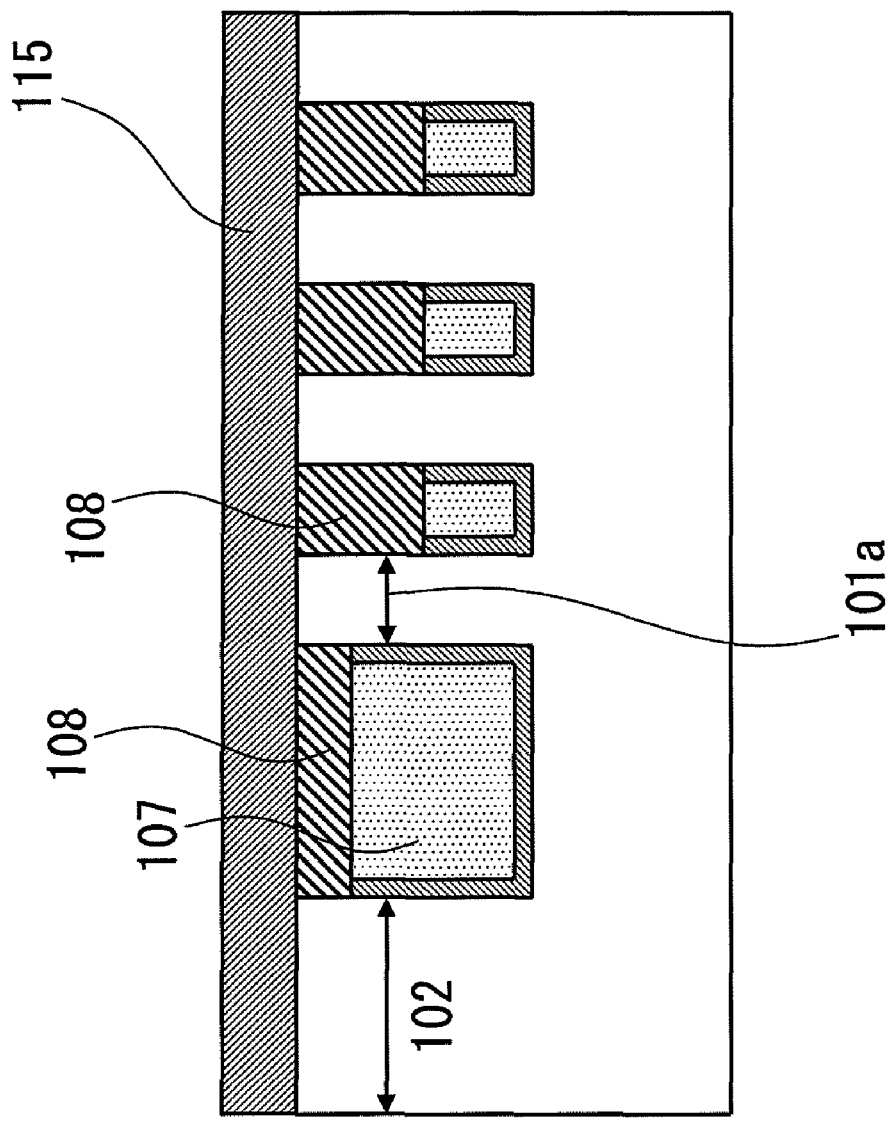
FIG. 5 is a diagram illustrating a step of the method for manufacturing the related semiconductor device.
Figure 6:
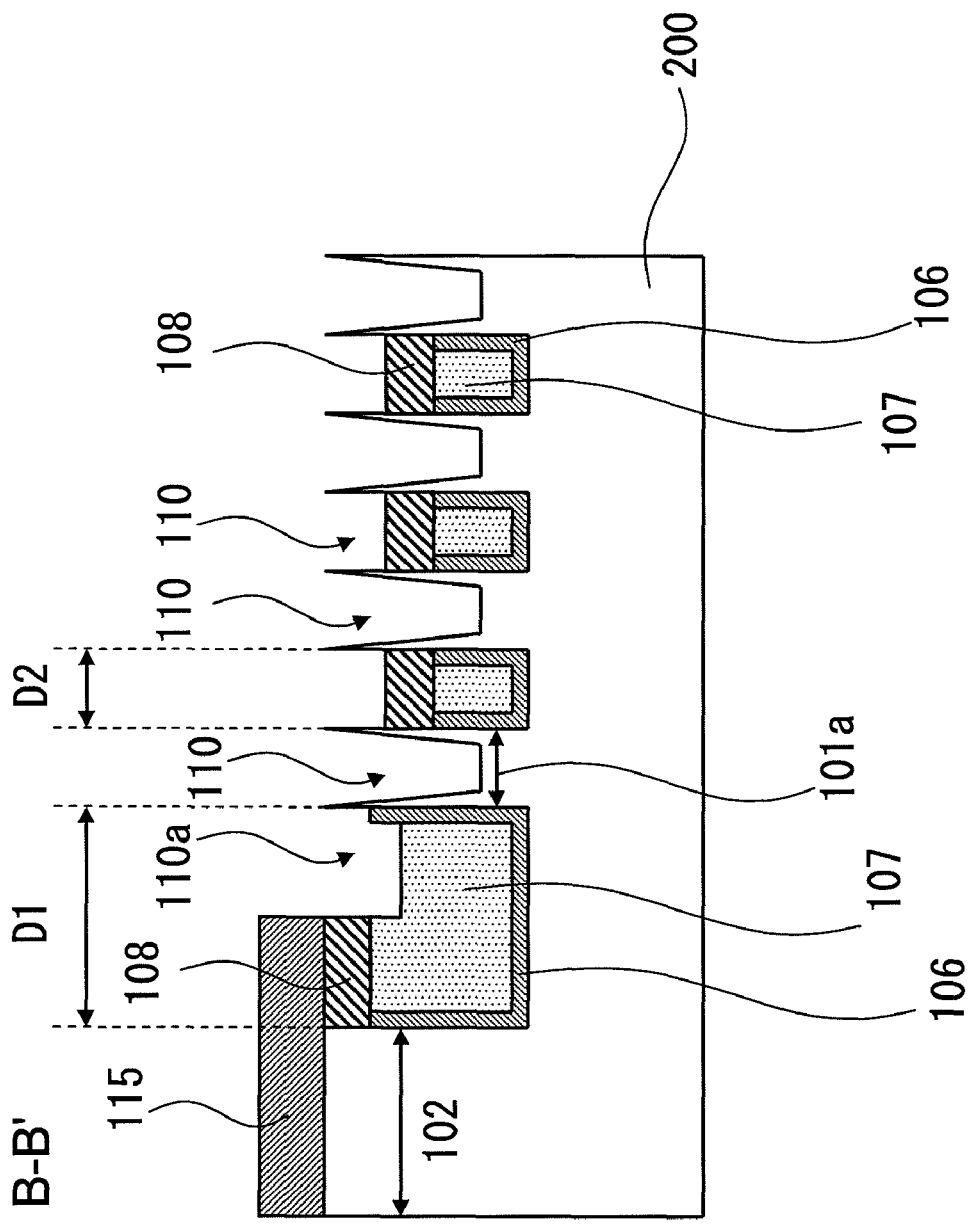
FIG. 6 is a diagram illustrating a step of the method for manufacturing the related semiconductor device.

In the drawing, numerals have the following meanings. 1, 1a, 3: active region, 2: active region, 6: liner film, 7: SOD region, 8: silicon oxide film, 10: trench, 15: silicon nitride film, 16: polycrystalline silicon film, 17: high-melting-point metal film, 20a, 20b: isolation region, 21: second direction, 22: first direction, 23: side portion, 30, 32: gate electrode, 31: dummy gate electrode, 33: isolation region, 34: source region and drain region, 35: gate insulating film, 36: buried portion, 37: extending portion, 41: MOS transistor, 57, 57a, 58, 58a, 59, 59a, 60: contact plug, 61: wiring layer, 65, 66, 67, 68: interlayer insulating film, 80: capacitor element, 85: wiring layer, 86: surface protect film, 101, 101a, 102: active region, 104: trench, 105: silicon nitride film, 106: liner film, 107: SOD region, 108: silicon oxide film, 110: trench, 115: silicon nitride film, 120: recess portion, 121, 122: conductive film remaining in recess portion, 123: depth direction, 200: semiconductor substrate, D1: first isolation region, D2: second isolation region.

DETAILED DESCRIPTION OF THE PREFERRED EMBODIMENTS

The present invention will be described below taking a DRAM as an example of a semiconductor device including a memory cell. Those skilled in the art will recognize that many alternative embodiments can be accomplished using the teachings of the present invention and that the invention is not limited to the embodiments illustrated for explanatory purposes.

Figure 8:
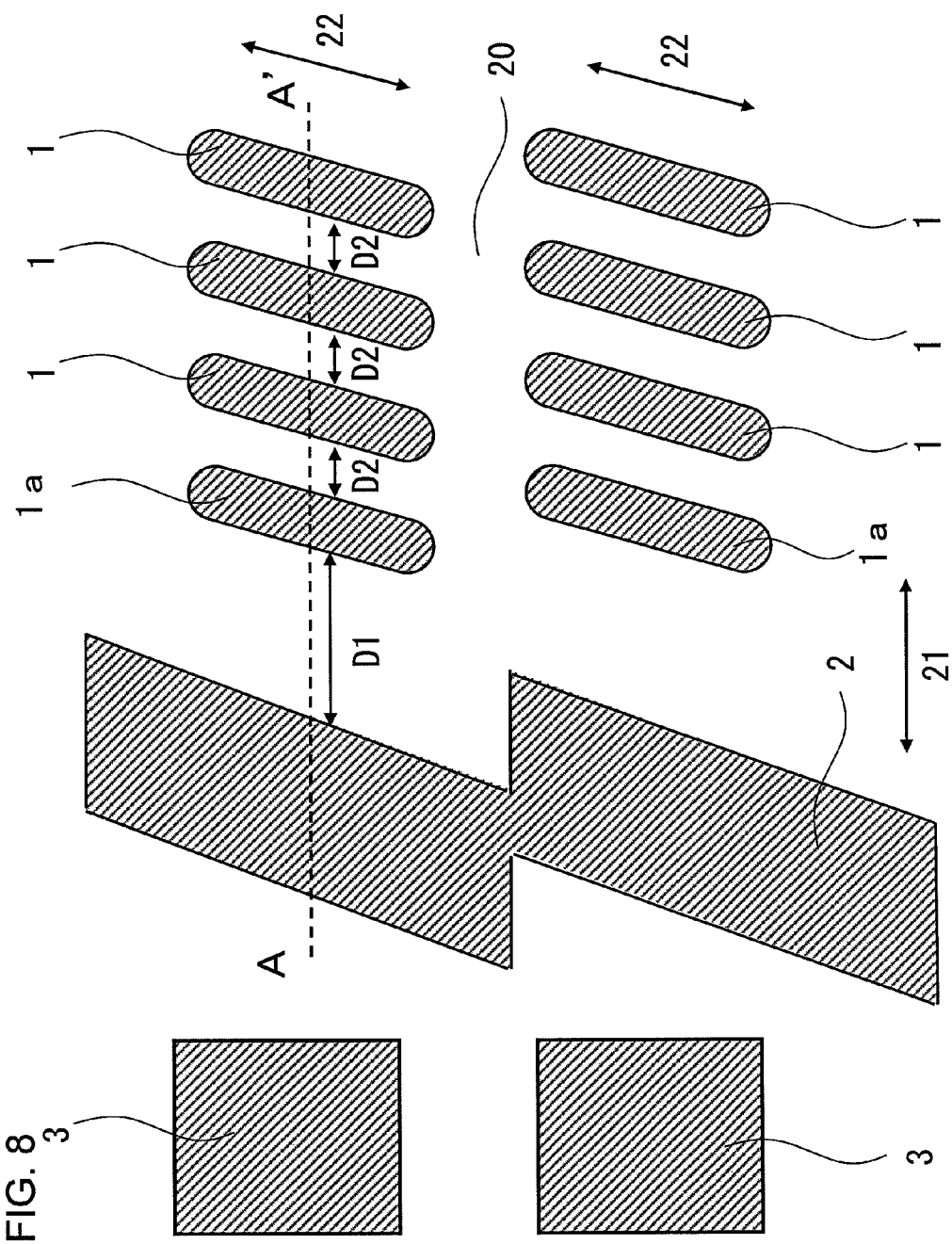
FIG. 8 is a diagram illustrating a step of an example of a method for manufacturing a semiconductor device according to the present invention.

FIG. 8 is a plan view schematically showing a region (corresponding to an element region) including an end of a memory cell region of a DRAM and a peripheral circuit region. FIG. 8 shows a layout of an active region (impurity diffusion layer region). Reference numeral 1 denotes a protruding active region (corresponding to a second semiconductor region; hereinafter sometimes simply referred to as an "active region") forming a memory cell and extending in first direction 22. Active regions 1 are periodically arranged in second direction 21 according to a predetermined rule. Each of active regions 1 is formed by forming isolation region 20 formed of STI, in a semiconductor substrate (not shown in the drawings) so as to partition the semiconductor substrate. Reference numeral 1a denotes a protruding active region at the end of the memory cell region (which active region corresponds to a first semiconductor region; hereinafter sometimes simply referred to as an "active region").

Reference numeral 2 denotes an active region (corresponding to a semiconductor portion) formed at a boundary portion between the memory cell region and the peripheral circuit region. Active region 2 is used to, for example, fix the substrate potential (well potential) of the memory cell region. Reference numeral 3 denotes an active region formed in the peripheral circuit region. A first isolation region is denoted by D1 (hereinafter sometimes simply referred to as an "isolation region"); the first isolation region is positioned between active region 1a at the end of the memory cell region and active region 2. A second isolation region is denoted by D2 (hereinafter sometimes simply referred to as an "isolation region"); second isolation region is positioned between active regions 1 inside the memory cell region. The isolation region between active region 1a at the end of the memory cell region and active region 1 located adjacent to active region 1a is similarly denoted by D2.

In the semiconductor device, a MOS transistor including a trench-shaped gate electrode structure is formed in the memory cell region. A MOS transistor including a planar gate electrode structure or a trench-shaped gate electrode structure is formed in the peripheral circuit region. Active region 1a at the end of the memory cell region serves as a dummy cell. That is, active region 1a serves as a memory cell not contributing to circuit operation of the DRAM. Specifically, active region 1a can be operated as a dummy cell by grounding a bit line connected to a source region or a drain region in the dummy cell without connecting the bit line to a sense amplifier, or fixing the bit line at a predetermined voltage.

When a pattern is formed using photolithography, forming a pattern of a desired shape at the end of the memory cell region is difficult because the pattern is discontinuous at the end of the memory cell region. Thus, in the present exemplary embodiment, by forming the dummy cell at the end of the memory cell region, a pattern for a memory cell (which contributes to the circuit operation) located adjacent to the dummy cell can be formed into the desired shape.

Instead of only one, outermost peripheral memory cell, at least two memory cells from the end of the memory cell region may serve as dummy cells. If the at least two memory cells from the end of the memory cell region serve as dummy cells, a gate electrode arrangement according to the present invention described below may be applied exclusively to the dummy cell at the end of the memory cell region. Alternatively, the first semiconductor regions may be formed at the opposite ends of the arrangement of the semiconductor regions in the second direction so as to serve as dummy cells.

The width of isolation region D1 at the end of the memory cell region is formed so as to be larger than that of isolation region D2 inside the memory cell region. The isolation region is formed by a method similar to the conventional one.

Figure 9:
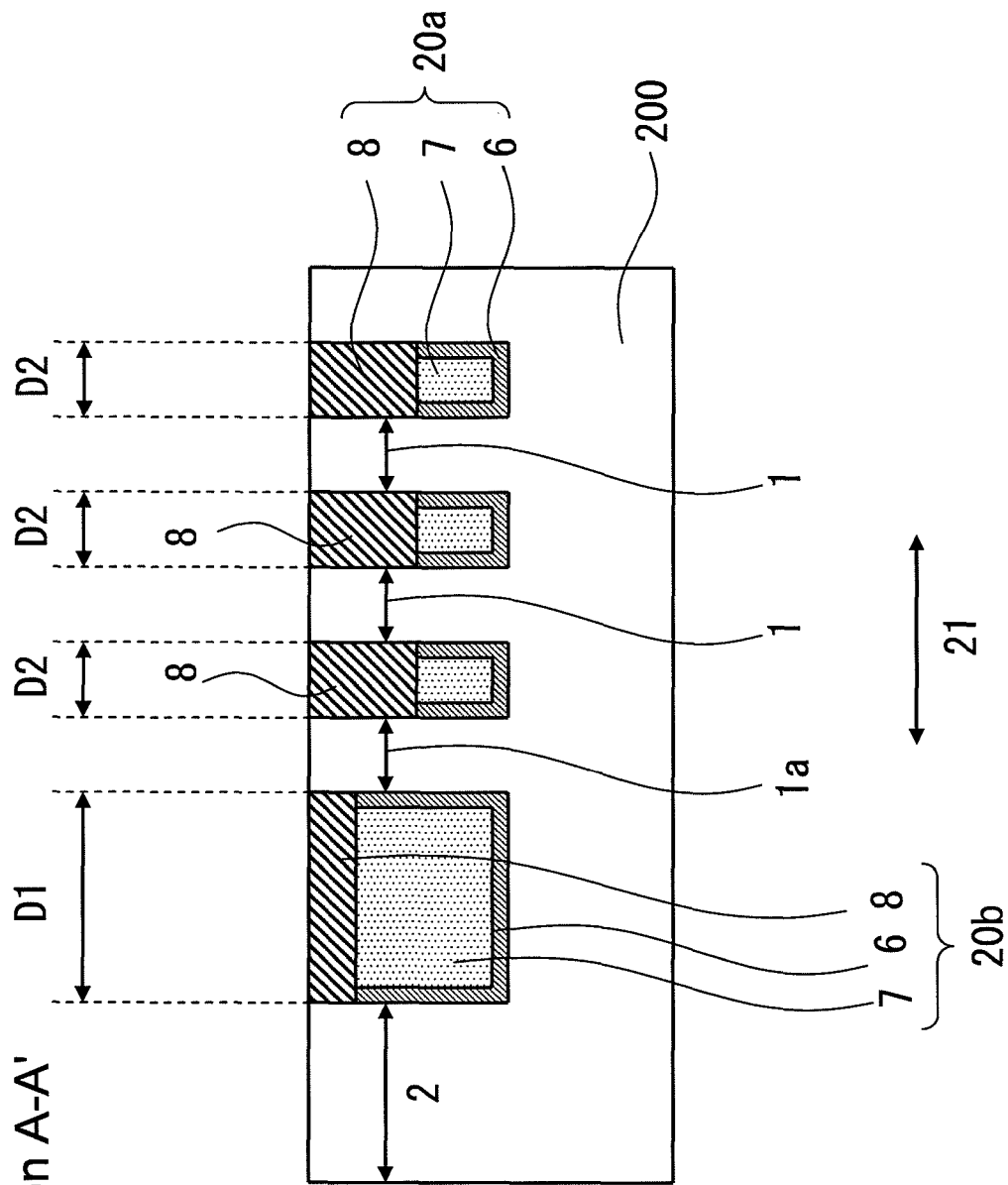
FIG. 9 is a diagram illustrating a step of the example of the method for manufacturing the semiconductor device according to the present invention.

FIG. 9 shows a cross section taken along line A-A' in FIG. 8. Isolation region 20a is formed as follows. A silicon nitride film is formed, as liner film 6, inside a second trench formed in P-type semiconductor substrate 200 made of silicon. SOD region 7 is then formed as a coating insulating layer. Silicon oxide film 8 is stacked and filled on SOD region 7 to form a two-layer structure. A thin silicon oxide film may be formed between liner film 6 and semiconductor substrate 200.

Similarly, isolation region 20b is formed by forming a silicon nitride film inside a first trench as liner film 6 and then stacking and filling SOD region 7 as a coating insulating layer and silicon oxide film 8 in two layers; silicon oxide film 8 is located on SOD region 7.

Polysilazane or the like may be used as SOD region 7. SOD region 7 is filled into the trench by coating and then subjected to a thermal treatment in an oxidizing atmosphere so as to be converted (reformed) into a dense film.

Silicon oxide film 8 is formed using an HDP (High Density Plasma)-CVD method or the like, so as to fill on SOD region 7 in the trench.

Isolation region D1 at the end of the memory cell region is wider than isolation region D2 inside the memory cell region. Thus, silicon oxide film 8, which is an upper layer of the STI, is formed to be thinner in D1 than in D2.

Figure 10:
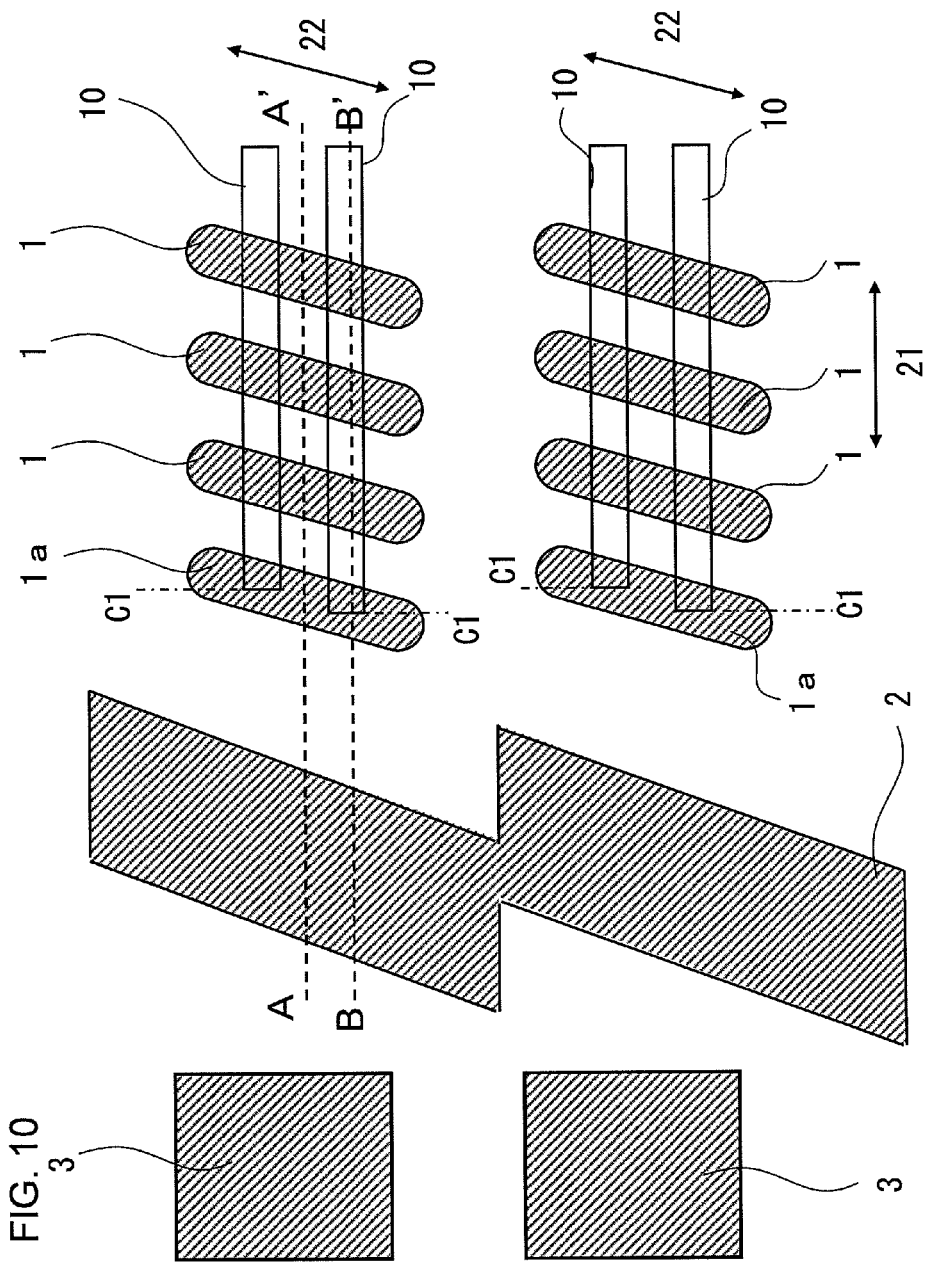
FIG. 10 is a diagram illustrating a step of the example of the method for manufacturing the semiconductor device according to the present invention.

FIG. 10 shows a pattern of the trench-shaped gate electrode formed in the memory cell region. The portion of trench 10 is removed by etching to form the trench pattern for the gate electrode. Two trenches 10 arranged parallel to each other are formed for one active region 1 or 1a.

In the present exemplary embodiment, trench 10 for the gate electrode does not completely cross the active region at the end of the memory cell region. As shown in FIG. 10, terminal C1 of trench 10 is formed to lie inside active region 1a at the end of the memory cell region. Furthermore, in the present exemplary embodiment, the planar MOS transistor is formed in the peripheral circuit region. Thus, no trench is formed on active region 3 in the peripheral circuit region.

Figure 11:
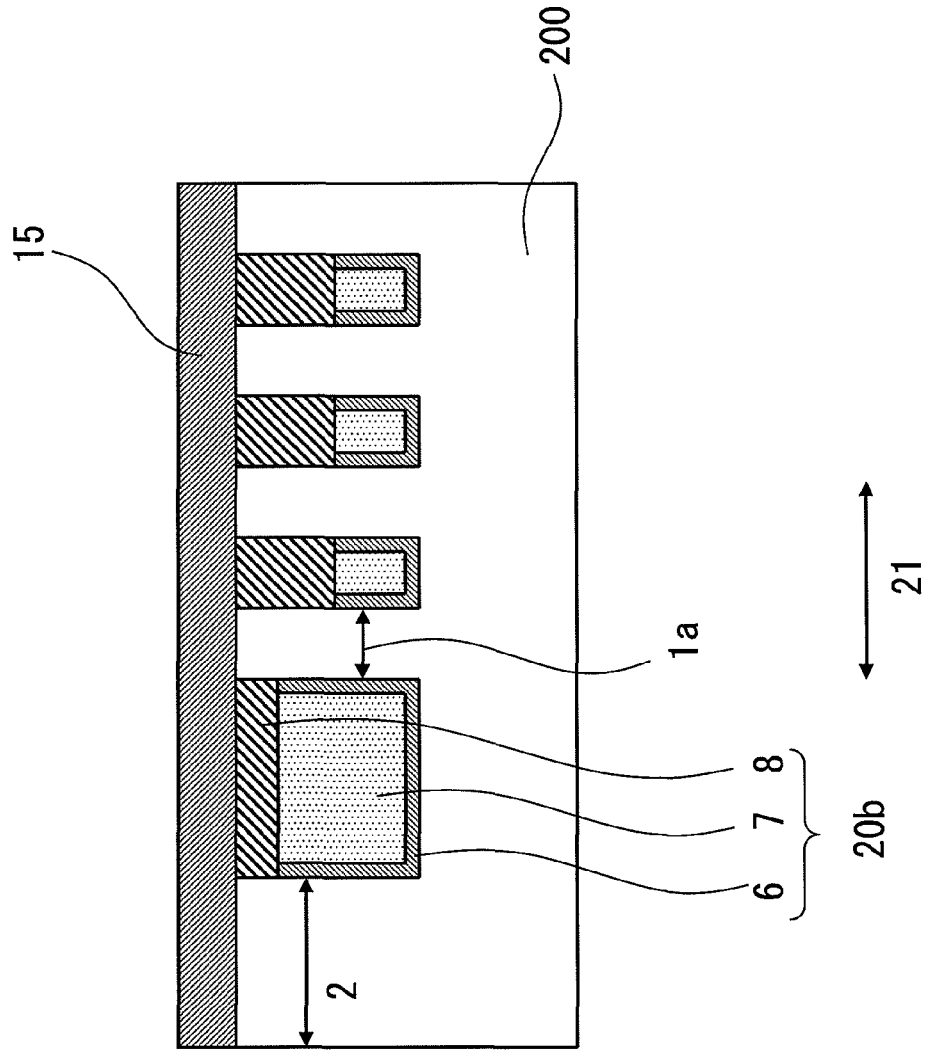
FIG. 11 is a diagram illustrating a step of the example of the method for manufacturing the semiconductor device according to the present invention.
Figure 12:
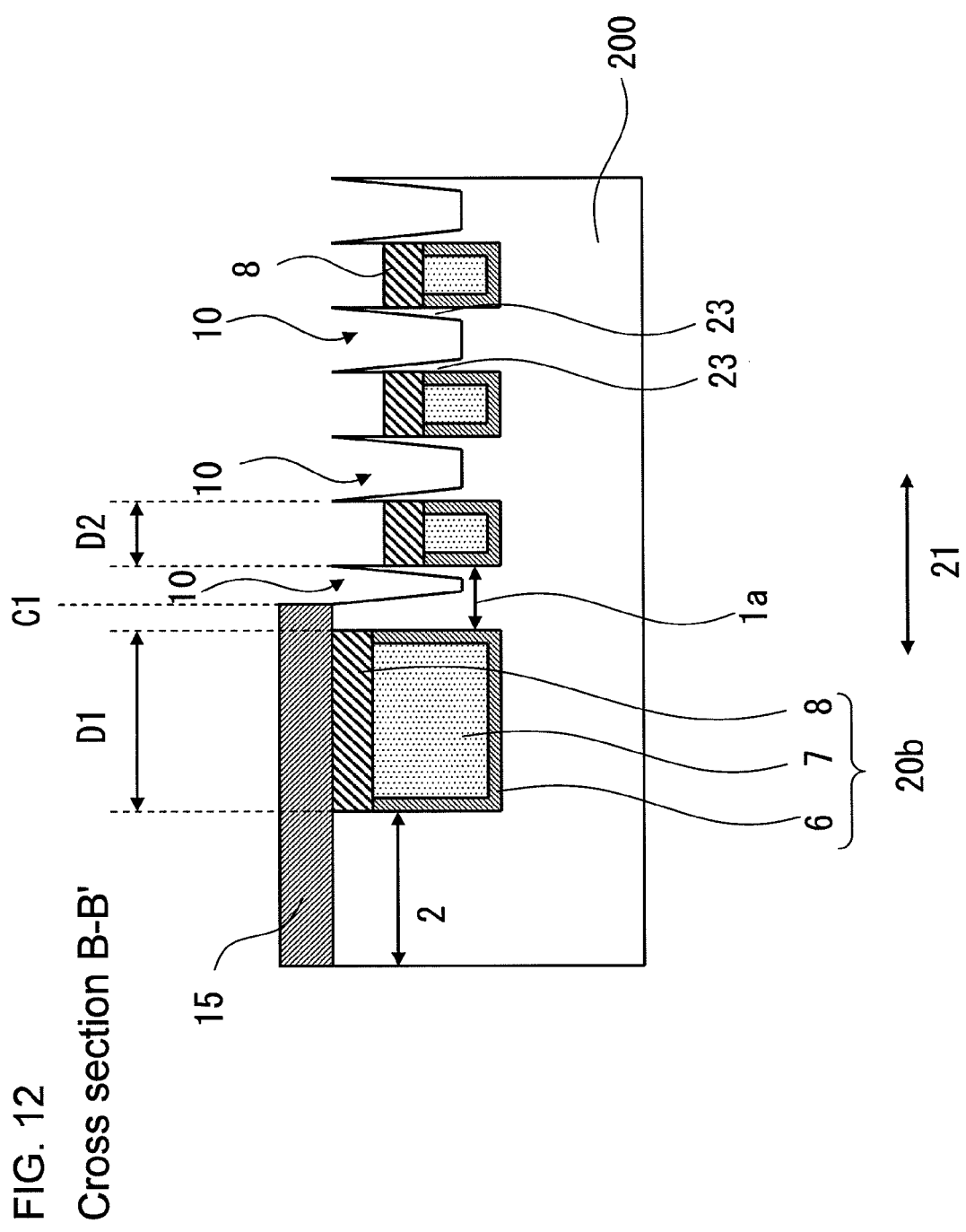
FIG. 12 is a diagram illustrating a step of the example of the method for manufacturing the semiconductor device according to the present invention.
Figure 13:
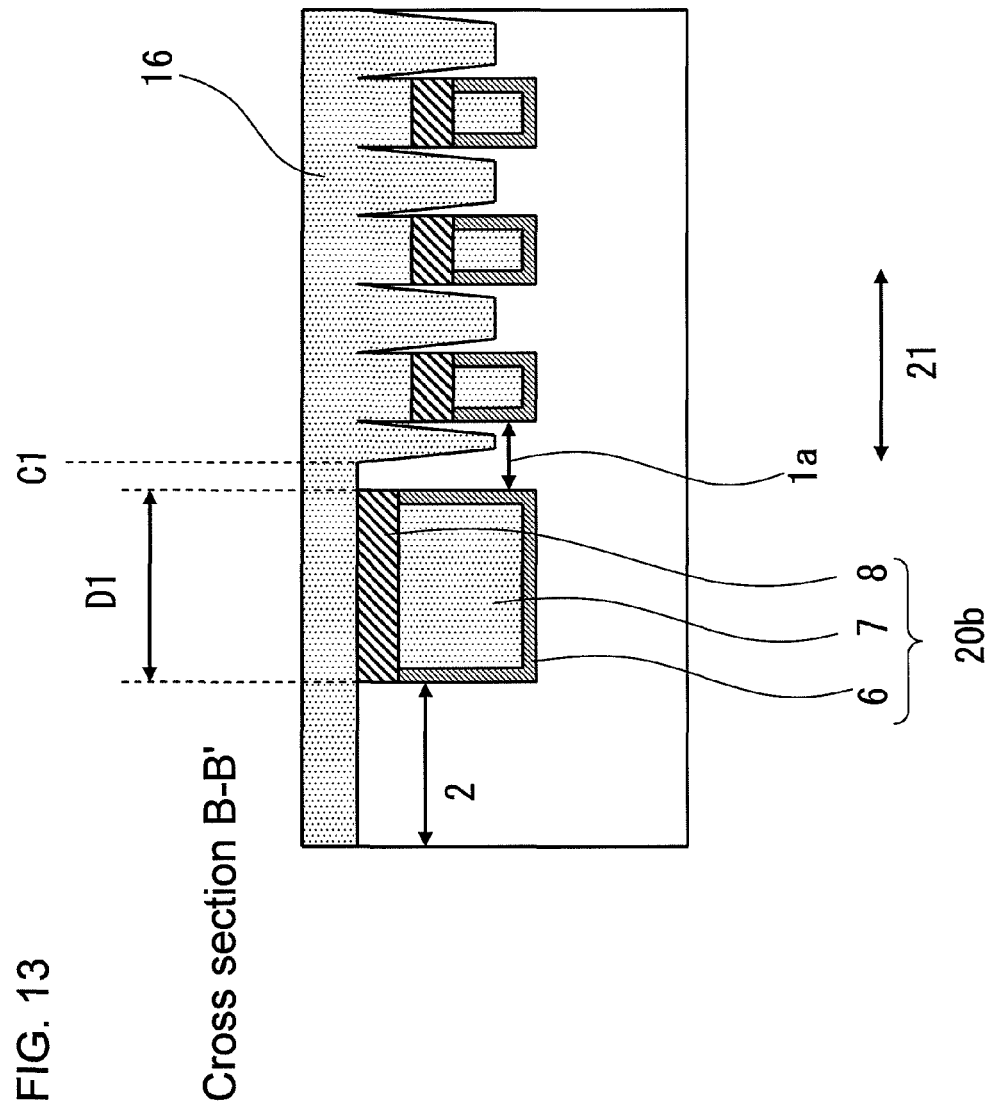
FIG. 13 is a diagram illustrating a step of the example of the method for manufacturing the semiconductor device according to the present invention.

FIG. 11 shows a cross section of the trench pattern for the gate electrode formed which is taken along line A-A' in FIG. 10. FIGS. 12 and 13 show a cross section of the trench pattern taken along line B-B' in FIG. 10. In FIG. 11, reference numeral 15 denotes a silicon nitride film used as a mask when the trench for the gate electrode is formed by etching. The photolithography technique is used to form an opening in silicon nitride film 15 at a position corresponding to trench 10.

In FIG. 12, the boundary (position C1 of an end of trench 10) of the opening in silicon nitride film 15 for a mask is positioned in active region 1a at the end, which is a dummy cell. In this structure, a region of semiconductor substrate 200 and silicon oxide film 8 in the isolation region not covered with silicon nitride film 15 are removed by etching to form trench 10. In the formation of trench 10, the silicon layer of semiconductor substrate 200 is left on side wall portions of isolation regions 20a and 20b in thin film form as shown in FIG. 12. The thin-film-like silicon layer in semiconductor region 1 makes up side portion 23 and can be used as a channel layer of the MOS transistor.

Figure 21:
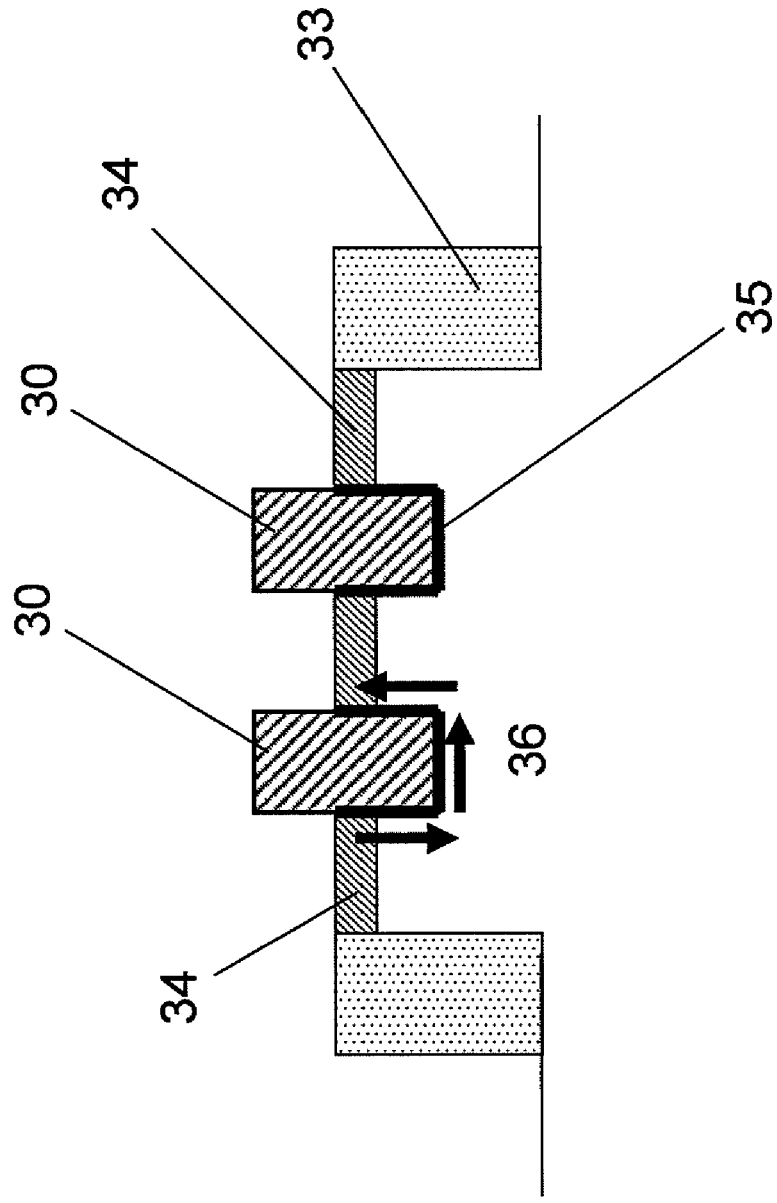
FIG. 21 is a diagram illustrating a field effect transistor making up an example of the semiconductor device according to the present invention.

Alternatively, a trench-shaped gate electrode may be formed without leaving the thin-film-like silicon layer on the side surface portion of trench 10. In this case, with the transistor on, the channel layer is formed along the boundary portion between the trench and the semiconductor substrate. FIG. 21 shows a sectional view of such a field effect transistor taken along line C-C' in FIG. 14, described below. As shown in FIG. 21, in this case, the channel layer is formed along the direction of arrow 36.

Figure 7:
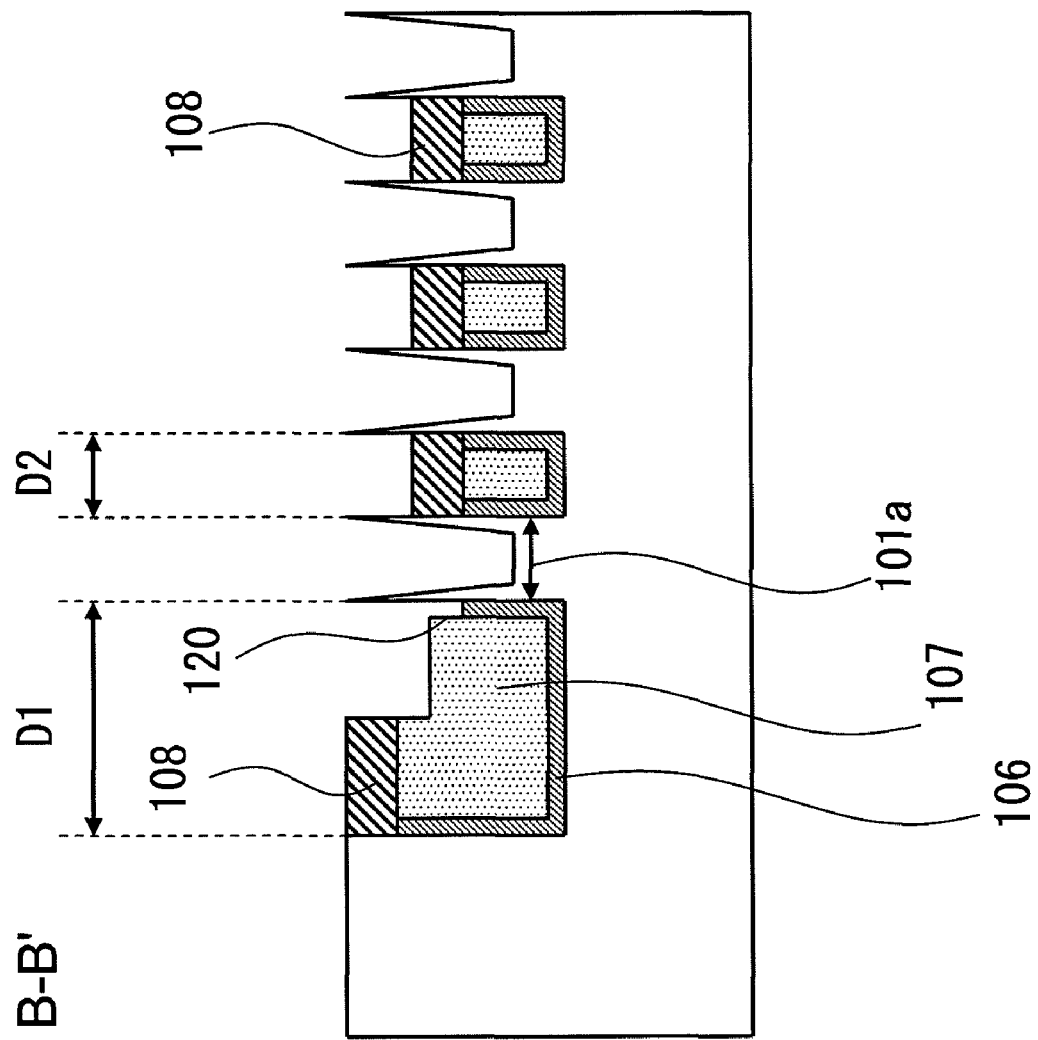
FIG. 7 is a diagram illustrating a step of the method for manufacturing the related semiconductor device.

Then, as shown in FIG. 13, silicon nitride film 15 for the mask is removed to form a gate insulating film (not shown in the drawings) using a silicon oxide film or the like. Polycrystalline silicon film 16 is formed so as to fill the interior of trench 10. In the present exemplary embodiment, end C1 of trench 10 for the gate electrode is positioned in active region 1a of the dummy cell positioned at the end of the memory cell region. Thus, liner film 6 in wide isolation region D1 at the end of the memory cell region is prevented from being exposed during the formation of trench 10. This prevents liner film 6 from being removed to form recess portion 120 as shown in FIG. 7.

Polycrystalline silicon film 16 makes up a gate electrode. Thus, impurities such as phosphorus are doped into polycrystalline silicon film 16 in order to reduce a resistance value. Furthermore, a high-melting-point metal film such as tungsten (W) is stacked in an upper portion of polycrystalline silicon film 16.

Then, the trench-shaped gate electrode is patterned, and at the same time, a part of the gate electrode of the planar MOS transistor is patterned which is located in the region (peripheral circuit region) other than the memory cell region.

Figure 14:
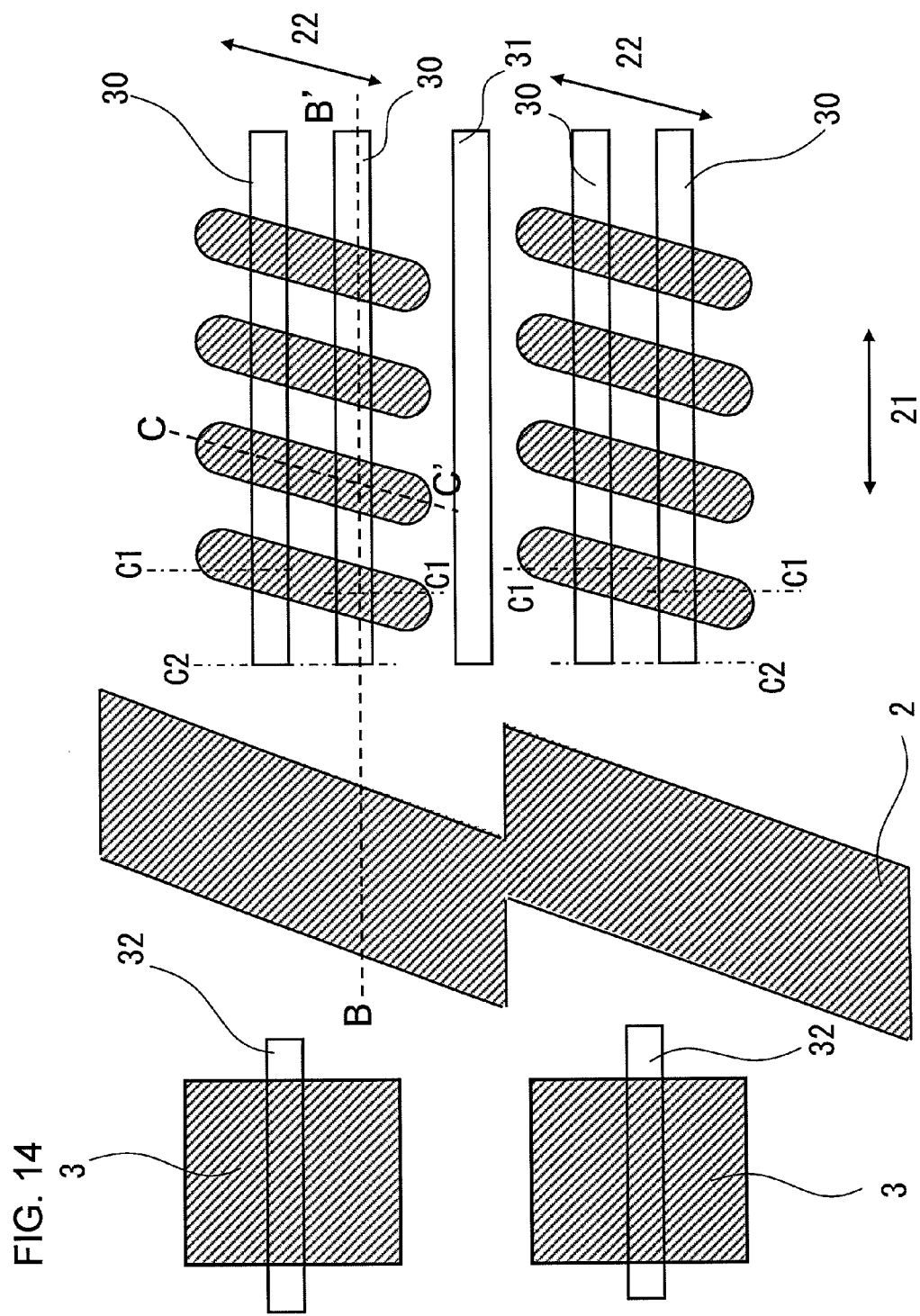
FIG. 14 is a diagram illustrating a step of the example of the method for manufacturing the semiconductor device according to the present invention.

FIG. 14 shows a plan view in this condition. Reference numeral 30 denotes the pattern of the gate electrode for the memory cell region (the interior of 30 is left) formed at a position where the pattern covers trench 10. Gate electrode 30 is formed at the same position as that of trench 10. However, end C2 of gate electrode 30 is located so as to extend to the outside of active region 1a. The position of the end of trench 10 is denoted by C1.

By thus locating end C2 of the gate electrode so that end C2 extends to the outside of active region 1a, the memory cell positioned at the end can be effectively utilized as a dummy cell that prevents possible deformation of the pattern. That is, by locating the dummy cell such that the shape of the dummy cell is as similar to that of the memory cell contributing to the circuit operation as possible, the adverse effect of possible deformation of the pattern on the adjacent memory cell (which contributes to the circuit operation) can be minimized if, for example, a contact plug connected to the active region is processed during a subsequent step. Reference numeral 31 denotes a dummy gate electrode located between the active regions of the memory cells so as to have the same width as that of gate electrode 30 for the memory cell and to extend parallel to gate electrode 30 for the memory cell. Dummy gate electrode 31 is not necessarily formed because no trench pattern is present in a lower portion thereof.

Reference numeral 32 denotes the gate electrode of the planar transistor located in the peripheral circuit region and formed in the upper portion of active region 3 via the gate insulating film already formed. Gate electrodes 30, 31, and 32 are formed by removing the already formed conductor for the gate electrode by etching using a photoresist as a mask covering each pattern.

Figure 15:
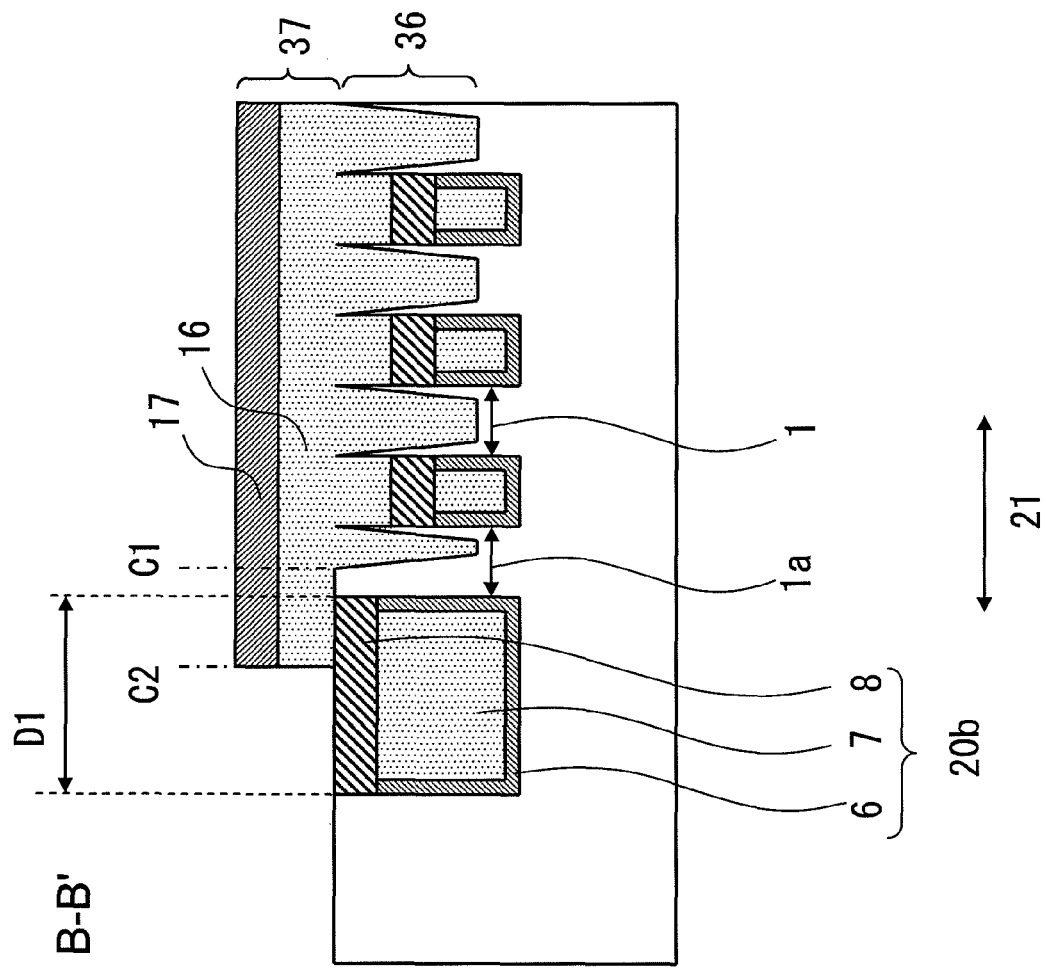
FIG. 15 is a diagram illustrating a step of the example of the method for manufacturing the semiconductor device according to the present invention.

FIG. 15 shows a sectional view of the semiconductor device after patterning of the gate electrode taken along line B-B'. Reference numeral 17 denotes the high-melting-point metal film stacked on polycrystalline silicon 16. The gate electrode comprises buried portions 36 buried in semiconductor regions 1 and 1a and extending portion 37 extending in second direction 21 so as to couple buried portions 36 together. A film such as tungsten nitride (WN) may be interposed between polycrystalline silicon film 16 and high-melting-point metal film 17.

End C1 of trench 10 is positioned in active region 1a of the dummy cell. An end of gate electrode 30 is positioned on isolation region D1 outside active region 1a. To form a source region and a drain region of the MOS transistor, N- or P-type impurities are doped into the active region. Then, an interlayer insulating film covering the gate electrode pattern is formed using a silicon oxide film or the like.

Figure 16:
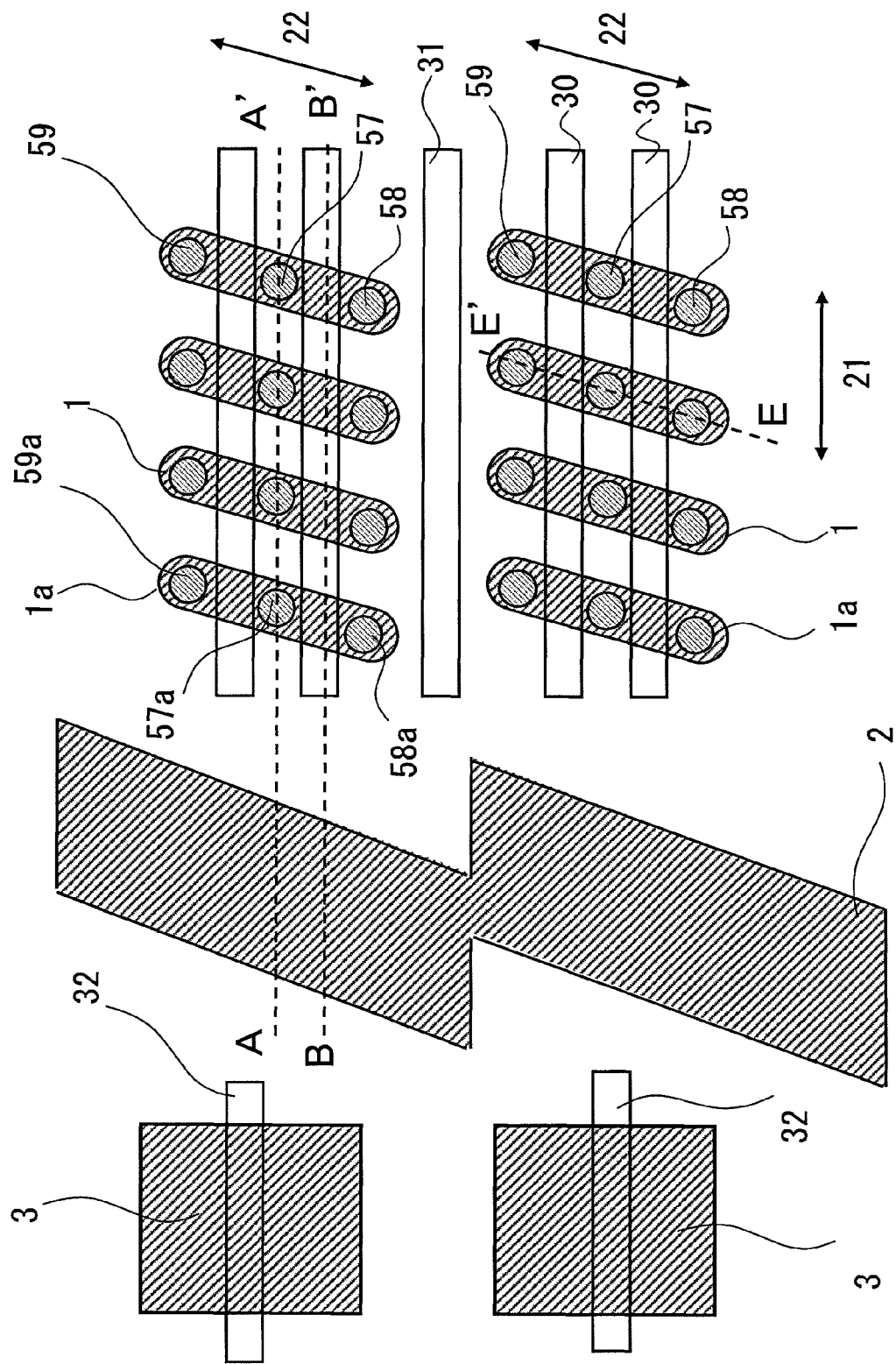
FIG. 16 is a diagram illustrating a step of the example of the method for manufacturing the semiconductor device according to the present invention.

Then, as shown in a plan view in FIG. 16, contact plugs 57, 58, and 59 are formed on active region 1 in the memory cell region. The contact plugs may be formed in a self-aligned manner utilizing the pattern of gate electrodes 30 and 31. On active region 1a of the dummy cell, gate electrode 30 is located to completely cross the active region as is the case with the other memory cells. Thus, even if the self-aligned manner is used, contact plugs 57a, 58a, and 59a can be formed as is the case with the other memory cells.

Figure 17:
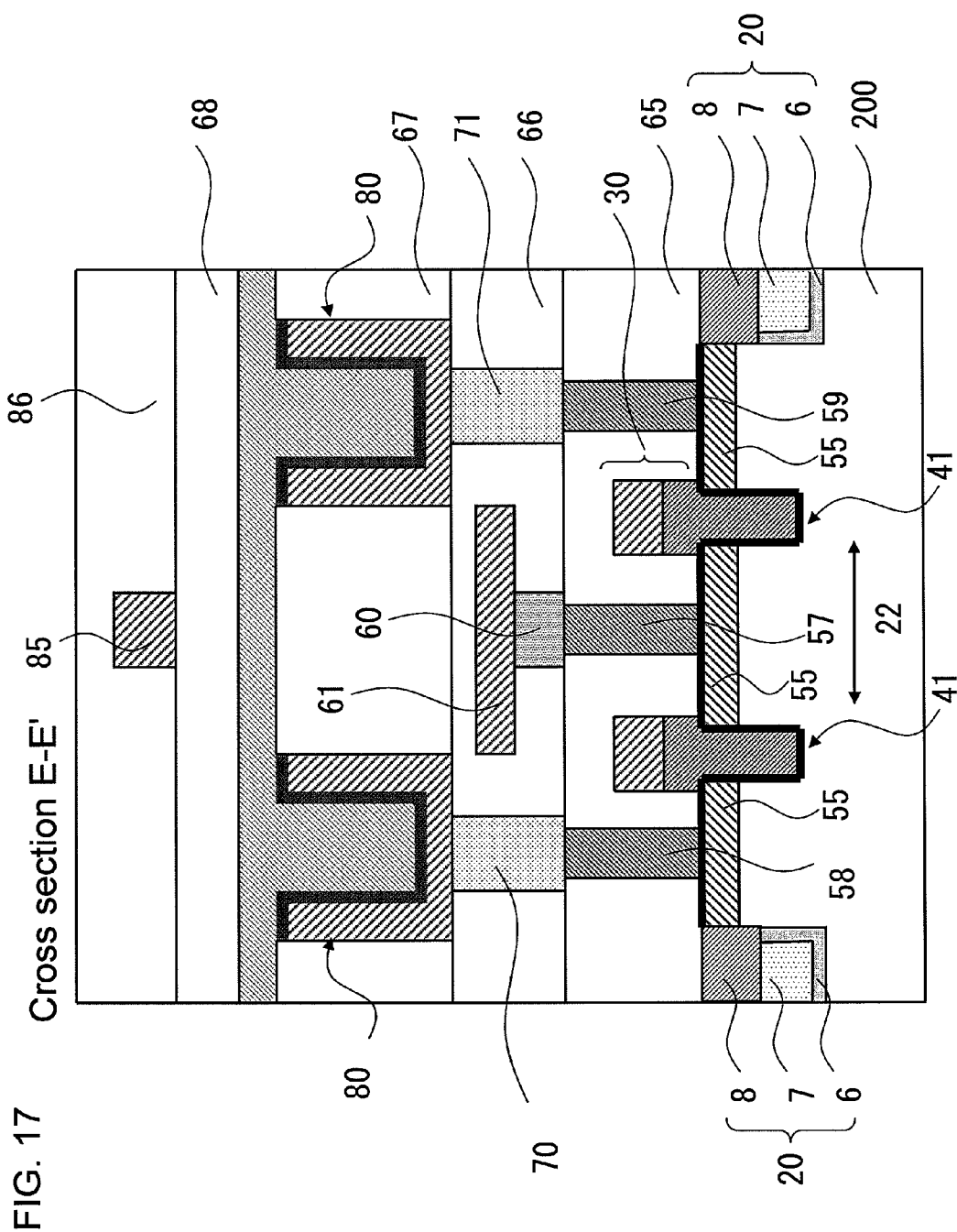
FIG. 17 is a diagram illustrating an example of the semiconductor device according to the present invention.
Figure 18:
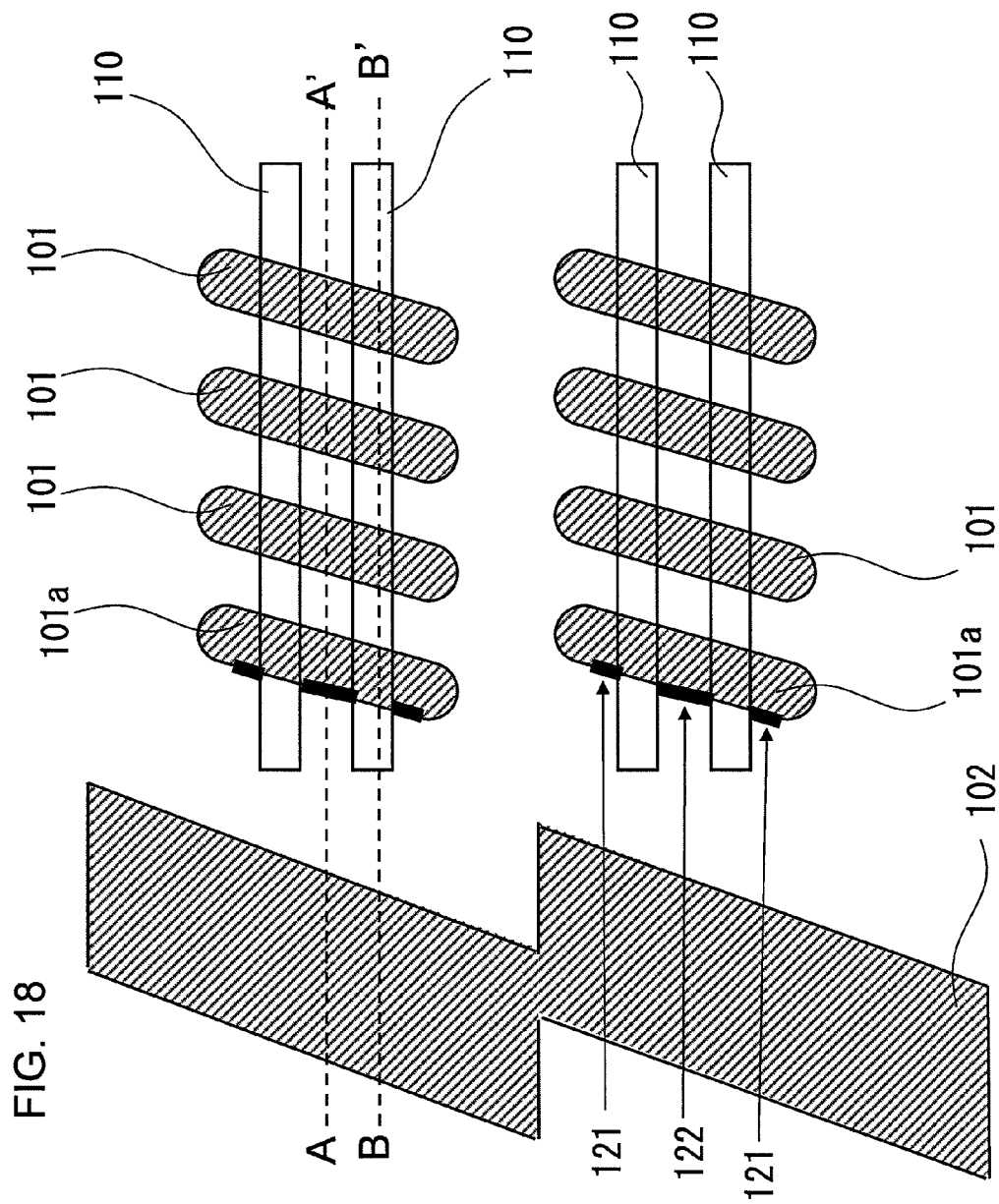
FIG. 18 is a diagram illustrating problems with the related semiconductor device.
Figure 19:
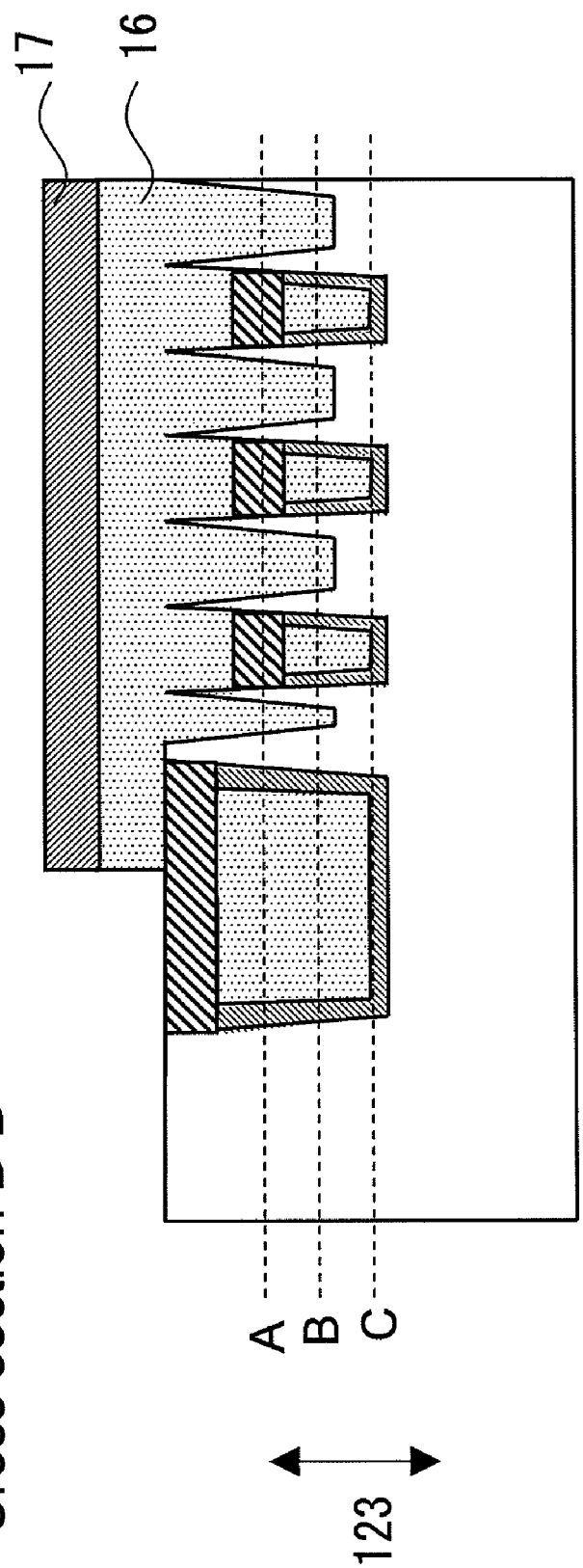
FIG. 19 is a diagram illustrating a relationship between the width of a first isolation region and the width of a second isolation region in a second direction.
Figure 20:
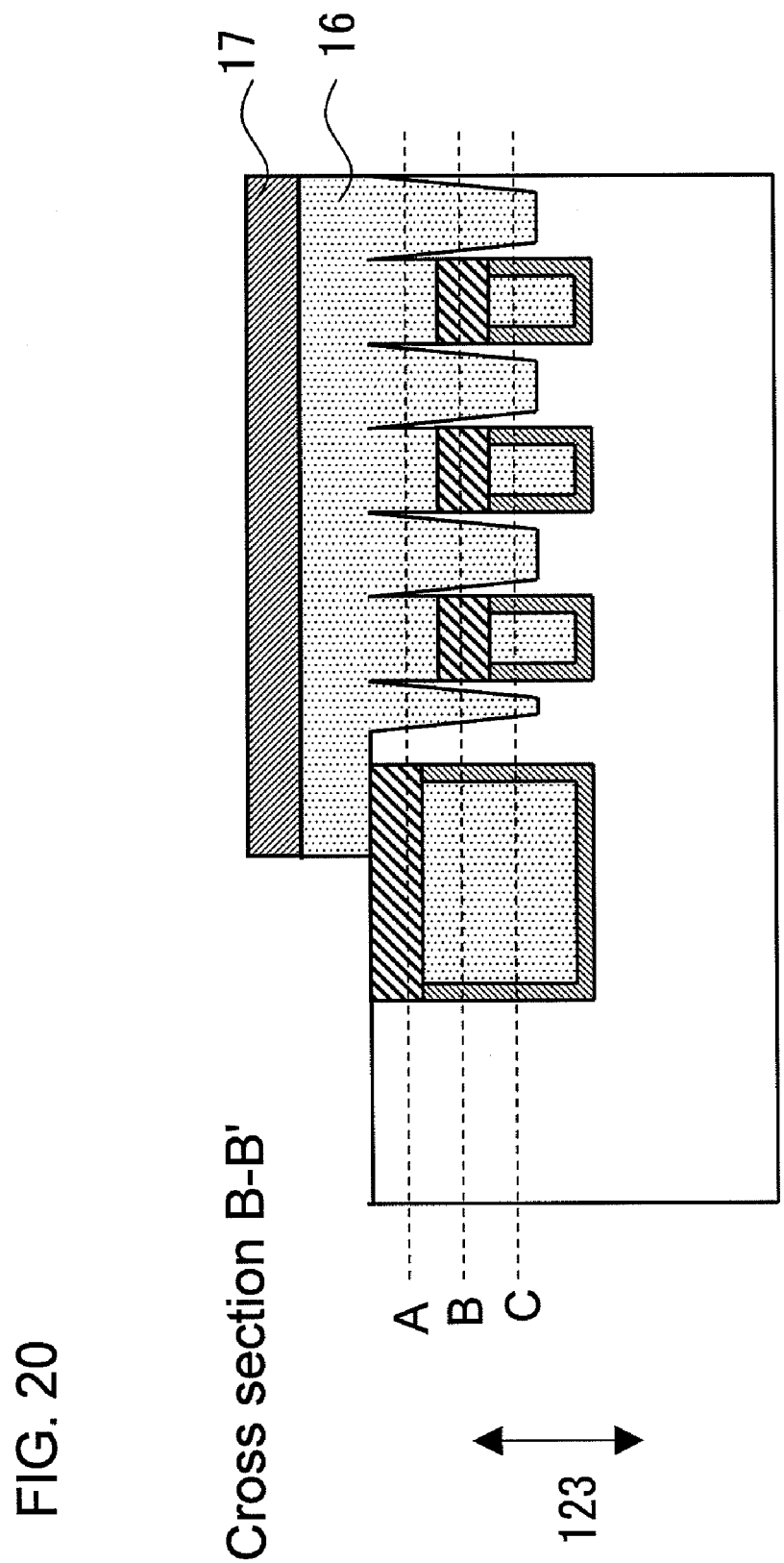
FIG. 20 is a diagram illustrating a relationship between the width of a first semiconductor region and the width of a second semiconductor region in the second direction.

FIG. 17 shows a sectional view of the memory cell formed until the memory cell reaches a final condition thereof; the view is taken along line E-E' in FIG. 16. Reference numeral 200 denotes a semiconductor substrate made up of P-type silicon into which P-type impurities such as Boron may further be doped to form a P-type well. Reference numeral 41 denotes a MOS transistor including gate electrode 30. A lower layer portion of gate electrode 30 is formed so as to fill the trench portion formed in semiconductor substrate 200. Gate electrode 30 functions as a word line. A side wall may be formed on a side wall portion of the gate electrode using a silicon nitride film or the like.

N-type impurity layer 55 is formed in a front surface portion of active region 1. N-type impurity layer 55 functions as the source and drain regions of the MOS transistor and is in contact with contact plugs 57, 58, and 59. Polycrystalline silicon into which phosphorous is doped can be used as a material for contact plugs 57, 58, and 59. Contact plug 57 is connected, via separately formed contact plug 60, to wiring layer 61 functioning as a bit line.

Wiring layer 61 is located so as to extend in a direction crossing the pattern of gate electrode 30. Wiring layer 61 may be curved instead of being linear. Tungsten (W) or the like may be used as a material for wiring layer 61.

Contact plugs 58 and 59 are connected to capacitor element 80 via separately formed contact plugs 70 and 71, respectively. Reference numerals 65, 66, 67, and 68 denote interlayer insulating films that insulate wires from one another. Capacitor element 80 comprises two electrodes and an insulating film such as aluminum oxide ($Al_2O_3$) or zirconium oxide ($ZrO_2$) sandwiched between two electrodes. Reference numeral 85 denotes a wiring layer formed of aluminum, copper, or the like as an upper layer. Reference numeral 86 denotes a surface protect film.

Turning on MOS transistor 41 enables determination, via the bit line (wiring layer 61), of whether or not changes are accumulated in capacitor element 80. MOS transistor 41 and capacitor element 80 thus operates as a DRAM memory cell that can perform an operation of storing information.

For the peripheral circuit region, in a step different from that of forming the memory cell region, contact plugs and a wiring layer connecting to active region 3 are formed to form a MOS transistor. The contact plugs and wiring layer may be partly formed in a manufacturing step common to the memory cell region and the peripheral circuit region. A side wall may be formed on a side surface of gate electrode 32 in the peripheral circuit region as a transistor including an LDD structure. For active region 2, positioned at the boundary between the memory cell region and the peripheral circuit region, a wiring layer is formed which is connected to active region 2 via contact plugs.

In the above description, the DRAM is taken as an example of the semiconductor device. However, the present invention is applicable to any semiconductor device other than the DRAM which includes a memory cell.

It is apparent that the present invention is not limited to the above embodiments, but may be modified and changed without departing from the scope and spirit of the invention.

What is claimed is:

1. A semiconductor device comprising:
    a semiconductor substrate;
    a semiconductor portion on the semiconductor substrate;
    an array of semiconductor regions on the semiconductor substrate, the array of semiconductor regions including a first semiconductor region extending in a first direction and a plurality of second semiconductor regions extending in the first direction, the first semiconductor region and the second semiconductor regions being periodically arranged in a second direction, the first semiconductor region being located at the shortest distance from the semiconductor portion in the second direction;
    a first isolation region formed between the semiconductor portion and the first semiconductor region;
    second isolation regions formed between the adjacent first and second semiconductor regions and between the adjacent second semiconductor regions, the second isolation regions being narrower than the first isolation region in the second direction;
    a liner film formed on an inner wall of trench making up each of the first and the second isolation regions;
    a dense film formed on the liner film in the trench making up each of the first and the second isolation regions;
    a gate electrode extending in the second direction, the gate electrode including buried portions buried in the first semiconductor region and each of the second semiconductor regions, and an extending portion coupling the buried portions together;
    a gate insulating film formed between the buried portion of the gate electrode and the semiconductor substrate at the second semiconductor region; and
    a source region and a drain region of a field effect transistor, the source and drain regions being formed in the second semiconductor region on both sides sandwiching the buried portion of the gate electrode in the first direction,
    wherein the buried portion of the gate electrode in the first semiconductor region is narrower than the buried portion of the gate electrode in the second semiconductor region in the second direction.

2. The semiconductor device according to claim 1, wherein the extending portion of the gate electrode includes a portion disposed over the first isolation region.

3. The semiconductor device according to claim 1,
wherein each of the first and the second isolation regions further includes an insulating film covering upper parts of the dense film and the liner film, and
the gate electrode is formed by etching the first and the second semiconductor regions without exposing the dense film and the liner film in the first and the second isolation regions, and then depositing a gate electrode material.

4. The semiconductor device according to claim 1,
wherein each of the first and the second semiconductor regions includes a side portion positioned in a intermediate portion of each of the first and the second semiconductor regions in the first direction and formed opposite a side surface of the buried portion buried in each of the first and the second semiconductor regions parallel to the first direction, and
the gate insulating film is in contact with the side portion of the second semiconductor region.

5. The semiconductor device according to claim 1, further comprising a memory cell region on the semiconductor substrate,
wherein the first semiconductor region and the second semiconductor regions are disposed in the memory cell region.

6. The semiconductor device according to claim 5, further comprising a wiring layer connected to one of the source region and the drain region.

7. The semiconductor device according to claim 1,
wherein the dense film is formed by thermal treatment of an insulating film in an oxidizing atmosphere.

8. A semiconductor device comprising:
a semiconductor substrate;
an array of semiconductor regions on the semiconductor substrate, the array of semiconductor regions including a first semiconductor region extending in a first direction and a plurality of second semiconductor regions extending in the first direction, the first semiconductor region and the second semiconductor regions being arranged in a second direction, the first semiconductor region making up a semiconductor region located at least at one end of the array in the second direction;
a gate electrode extending in the second direction, the gate electrode including buried portions buried in the first semiconductor region and each of the second semiconductor regions, and an extending portion coupling the buried portions together;
a gate insulating film formed in contact with the buried portion of the gate electrode buried in the second semiconductor region; and
a source region and a drain region of a field effect transistor, the source and drain regions being formed in the second semiconductor region on both sides sandwiching the buried portion of the gate electrode in the first direction,
wherein the buried portion of the gate electrode in the first semiconductor region is narrower than the buried portion of the gate electrode in the second semiconductor region in the second direction.

9. The semiconductor device according to claim 8, comprising a first isolation region located adjacent to the first semiconductor region and positioned, in the second direction, opposite a side on which the first semiconductor region lies opposite the second semiconductor region,
wherein the first isolation region includes a liner film on an inner wall of a trench making up the first isolation region, and an insulating film formed on the liner film in the trench.

10. The semiconductor device according to claim 9,
wherein the gate electrode extends so that an end thereof is positioned over the first isolation region.

11. The semiconductor device according to claim 8,
wherein each of the first and the second semiconductor regions includes a side portion positioned in a intermediate portion of each of the first and the second semiconductor regions in the first direction and formed opposite a side surface of the buried portion buried in each of the first and the second semiconductor regions parallel to the first direction, and
the gate insulating film is in contact with the side portion of the second semiconductor region.

12. The semiconductor device according to claim 8,
wherein the array of semiconductor regions are disposed in a memory cell region of the semiconductor device.

13. A semiconductor device comprising:
a dummy pattern including a first semiconductor region extending in a first direction;
a second semiconductor region extending in the first direction;
a gate electrode extending in the second direction, the gate electrode including buried portions buried in the first semiconductor region and each of the second semiconductor regions, and an extending portion coupling the buried portions together; and
a field effect transistor including the gate electrode,
wherein the dummy pattern and the field effect transistor make up an array arranged in the second direction, and
the dummy pattern is located at least at one end of the array in the second direction, and
the buried portion of the gate electrode in the first semiconductor region is narrower than the buried portion of the gate electrode in the second semiconductor region in the second direction.

14. The semiconductor device according to claim 13,
wherein the extending portion further extends from a portion on the buried portion in the first semiconductor region along the second direction, in a direction opposite to a direction from the first semiconductor region to the second semiconductor region.

15. The semiconductor device according to claim 13, further comprising a semiconductor portion formed on a side of first semiconductor region which is located opposite a side thereof on which the first semiconductor region faces the second semiconductor region, the semiconductor portion being insulated from the first semiconductor region.

16. The semiconductor device according to claim 13, further comprising:
a gate insulating film formed in contact with the buried portion in the second semiconductor region; and
a source region and a drain region formed in the second semiconductor region on both sides thereof sandwiching the buried portion of the gate electrode in the first direction.

17. The semiconductor device according to claim 16,
wherein each of the first and the second semiconductor regions includes a side portion positioned in a intermediate portion of each of the first and the second semiconductor regions in the first direction and formed opposite a side surface of the buried portion buried in each of the first and the second semiconductor regions parallel to the first direction, and
the gate insulating film is in contact with the side portion of the second semiconductor region.

* * * * *